US012784933B2

(12) United States Patent
Messier et al.

(10) Patent No.: US 12,784,933 B2
(45) Date of Patent: Nov. 3, 2026

(54) MULTIPLE BRANCH BUS BAR FOR CORELESS CURRENT SENSING APPLICATION

(71) Applicant: Allegro MicroSystems, LLC, Manchester, NH (US)

(72) Inventors: Loïc André Messier, Vanzy (FR); Yannick Vuillermet, La Motte Servolex (FR); Evan Shorman, Hooksett, NH (US); Simon E. Rock, Heidelberg (DE); Andreas P. Friedrich, Metz-Tessy (FR)

(73) Assignee: Allegro MicroSystems, LLC, Manchester, NH (US)

( * ) Notice: Subject to any disclaimer, the term of this patent is extended or adjusted under 35 U.S.C. 154(b) by 169 days.

(21) Appl. No.: 18/794,215

(22) Filed: Aug. 5, 2024

(65) Prior Publication Data

US 2024/0412891 A1 Dec. 12, 2024

Related U.S. Application Data

(63) Continuation of application No. 17/695,193, filed on Mar. 15, 2022, now Pat. No. 12,112,865.

(51) Int. Cl.
*H01B 5/02* (2006.01)
*G01R 19/00* (2006.01)
*H02G 5/00* (2006.01)

(52) U.S. Cl.
CPC .......... *H01B 5/02* (2013.01); *G01R 19/0092* (2013.01); *H02G 5/00* (2013.01)

(58) Field of Classification Search
CPC .......... H01B 5/02; G01R 33/00; G01R 33/09; G01R 33/02; G01R 19/00; G01R 19/0092;
(Continued)

(56) References Cited

U.S. PATENT DOCUMENTS 4,757,420 A 7/1988 Saletta et al.
5,041,780 A 8/1991 Rippel
(Continued)

FOREIGN PATENT DOCUMENTS

CN 112649645 A 4/2021
CN 111033276 B * 2/2022 ............ G01R 15/20
(Continued)

OTHER PUBLICATIONS

Final Office Action Dated Feb. 26, 2025 for U.S. Appl. No. 18/300,776, 16 pages.
(Continued)

*Primary Examiner* — Son T Le
(74) *Attorney, Agent, or Firm* — Daly, Crowley, Mofford & Durkee, LLP.

(57) ABSTRACT

A system comprising: a conductor having a through-hole and a first notch that are formed therein, the through-hole and the first notch being arranged to define, at least in part, a first branch of the conductor, and the through-hole also being arranged to define, at least in part, a second branch of the conductor; and a current sensor that is disposed directly above the first branch of the conductor and the side of the second branch of the conductor, such that no portion of the current sensor is situated directly above the second branch.

26 Claims, 19 Drawing Sheets

(58) Field of Classification Search
CPC .... G01R 15/148; G01R 15/207; G01R 15/14; G01R 15/20; H02G 5/00
See application file for complete search history.

(56) References Cited

U.S. PATENT DOCUMENTS

| | | | |
|---|---|---|---|
| 6,300,617 | B1 | 10/2001 | Daughton et al. |
| 6,356,068 | B1 | 3/2002 | Steiner et al. |
| 6,512,359 | B1 | 1/2003 | Tamai et al. |
| 6,583,613 | B1 | 6/2003 | Hohe et al. |
| 6,781,359 | B2 | 8/2004 | Stauth et al. |
| 6,995,315 | B2 | 2/2006 | Sharma et al. |
| 7,075,287 | B1 | 7/2006 | Mangtani et al. |
| 7,166,807 | B2 | 1/2007 | Gagnon et al. |
| 7,476,816 | B2 | 1/2009 | Doogue et al. |
| 7,598,601 | B2 | 10/2009 | Taylor et al. |
| 7,709,754 | B2 | 5/2010 | Doogue et al. |
| 7,746,056 | B2 | 6/2010 | Stauth et al. |
| 7,816,905 | B2 | 10/2010 | Doogue et al. |
| 7,923,996 | B2 | 4/2011 | Doogue et al. |
| 7,936,164 | B2 | 5/2011 | Doogue et al. |
| 8,030,918 | B2 | 10/2011 | Doogue et al. |
| 8,080,994 | B2 | 12/2011 | Taylor et al. |
| 8,447,556 | B2 | 5/2013 | Friedrich et al. |
| 8,542,010 | B2 | 9/2013 | Cesaretti et al. |
| 8,680,846 | B2 | 3/2014 | Cesaretti et al. |
| 8,692,546 | B2 | 4/2014 | Cesaretti et al. |
| 8,818,749 | B2 | 8/2014 | Friedrich et al. |
| 8,847,590 | B2 | 9/2014 | Flock et al. |
| 8,896,295 | B2 | 11/2014 | Friedrich et al. |
| 8,907,669 | B2 | 12/2014 | Petrie |
| 9,081,041 | B2 | 7/2015 | Friedrich et al. |
| 9,151,807 | B2 | 10/2015 | Friedrich et al. |
| 9,201,122 | B2 | 12/2015 | Cesaretti et al. |
| 9,557,352 | B2 | 1/2017 | Akimoto et al. |
| 10,481,181 | B2 | 11/2019 | Bussing et al. |
| 10,761,120 | B2 | 9/2020 | Feucht et al. |
| 10,884,031 | B2 | 1/2021 | Vuillermet et al. |
| 10,908,190 | B2 | 2/2021 | Bussing et al. |
| 11,047,884 | B2 | 6/2021 | Shimizu |
| 11,047,928 | B2 | 6/2021 | Vuillermet et al. |
| 11,099,217 | B2 | 8/2021 | Vuillermet et al. |
| 11,226,382 | B2 | 1/2022 | Augendre et al. |
| 11,320,466 | B1 | 5/2022 | Briano et al. |
| 11,395,402 | B2 | 7/2022 | Sutono |
| 11,555,832 | B2 | 1/2023 | Friedrich et al. |
| 11,656,250 | B2 | 5/2023 | Vuillermet et al. |
| 11,892,476 | B2 | 2/2024 | Rock et al. |
| 11,940,470 | B2 | 3/2024 | Messier et al. |
| 12,306,217 | B2 | 5/2025 | Houis |
| 2007/0279053 | A1 | 12/2007 | Taylor et al. |
| 2008/0231255 | A1 | 9/2008 | Lepine et al. |
| 2009/0121704 | A1 | 5/2009 | Shibara |
| 2011/0270553 | A1 | 11/2011 | Ausserlechner et al. |
| 2012/0001617 | A1 | 1/2012 | Reynolds |
| 2012/0112365 | A1 | 5/2012 | Ausserlechner et al. |
| 2012/0146164 | A1 | 6/2012 | Ausserlechner |
| 2012/0253726 | A1 | 10/2012 | Xu |
| 2012/0262152 | A1 | 10/2012 | Ausserlechner |
| 2013/0015843 | A1 | 1/2013 | Doogue et al. |
| 2013/0135548 | A1 | 5/2013 | Burberry et al. |
| 2013/0335076 | A1 | 12/2013 | Sakamoto et al. |
| 2014/0041923 | A1 | 2/2014 | Hisada et al. |
| 2014/0111196 | A1 | 4/2014 | Sakai et al. |
| 2014/0253103 | A1 | 9/2014 | Racz et al. |
| 2014/0266181 | A1 | 9/2014 | Milano et al. |
| 2014/0300349 | A1 | 10/2014 | Walker et al. |
| 2014/0312883 | A1 | 10/2014 | Friedrich et al. |
| 2015/0204916 | A1 | 7/2015 | Akimoto et al. |
| 2015/0204919 | A1 | 7/2015 | Akimoto et al. |
| 2015/0257261 | A1 | 9/2015 | Kitagawa |
| 2015/0301149 | A1 | 10/2015 | Cesaretti et al. |
| 2015/0323568 | A1 | 11/2015 | Schmitt |
| 2015/0331079 | A1 | 11/2015 | Kolwalker et al. |
| 2015/0338444 | A1 | 11/2015 | Ivanov et al. |
| 2015/0362532 | A1 | 12/2015 | Chartouni |
| 2016/0011239 | A1 | 1/2016 | Yoon et al. |
| 2016/0223594 | A1 | 8/2016 | Suzuki et al. |
| 2016/0274060 | A1 | 9/2016 | Deneneberg et al. |
| 2016/0282388 | A1 | 9/2016 | Milano et al. |
| 2017/0131329 | A1 | 5/2017 | Gorai et al. |
| 2017/0242058 | A1 | 8/2017 | Kawanami et al. |
| 2017/0285075 | A1 | 10/2017 | Okuyama et al. |
| 2018/0003742 | A1 | 1/2018 | Shimizu |
| 2018/0031613 | A1 | 2/2018 | Nakayama |
| 2018/0180649 | A1 | 6/2018 | Paci et al. |
| 2018/0238938 | A1 | 8/2018 | Feucht et al. |
| 2018/0321283 | A1 | 11/2018 | Sei et al. |
| 2019/0187187 | A1 | 6/2019 | Umetsu et al. |
| 2019/0212372 | A1 | 7/2019 | Bilbao de Mendizabal et al. |
| 2019/0391185 | A1 | 12/2019 | El Bacha et al. |
| 2020/0011902 | A1 | 1/2020 | Shimizu |
| 2020/0057097 | A1 | 2/2020 | Vuillermet et al. |
| 2020/0057120 | A1 | 2/2020 | Belin et al. |
| 2020/0132725 | A1 | 4/2020 | Krummenacher et al. |
| 2020/0300919 | A1 | 9/2020 | Song |
| 2021/0080489 | A1 | 3/2021 | Koizumi |
| 2021/0242353 | A1 | 8/2021 | Kim et al. |
| 2021/0311136 | A1 | 10/2021 | Augendre et al. |
| 2022/0018880 | A1 | 1/2022 | Houis |
| 2023/0071087 | A1 | 3/2023 | Vuillermet et al. |
| 2023/0251290 | A1 | 8/2023 | Vuillermet et al. |

FOREIGN PATENT DOCUMENTS

| | | | |
|---|---|---|---|
| EP | 1882953 | A1 | 1/2008 |
| GB | 2547732 | | 8/2017 |
| KR | 20230001089 | | 1/2023 |
| WO | WO 2017/144715 | A1 | 8/2017 |

OTHER PUBLICATIONS

Notice of Allowance dated Oct. 15, 2025 for U.S. Appl. No. 18/434,967, 11 pages.

Office Action dated Nov. 20, 2024 for U.S. Appl. No. 18/300,776, 22 pages.

U.S. Non-Final Office Action dated Nov. 26, 2025 for U.S. Appl. No. 18/691,998; 11 Pages.

Response to European Communication dated Apr. 8, 2024 filed on Oct. 1, 2024 for European Application No. 22754690.0, 18 pages.

Response to European Extended Search Report dated Sep. 20, 2024 filed on Apr. 7, 2025 for European Application No. 24166728.6, 20 pages.

Response to Final Office Action Dated Feb. 26, 2025, filed Apr. 23, 2025 for U.S. Appl. No. 18/300,776, 10 pages.

Notice of Allowance dated May 7, 2025 for U.S. Appl. No. 18/300,776, 9 pages.

Allegro MicroSystems datasheet "ACS37612 Coreless, High Precision, Hall-Effect Current Sensor IC with Common-Mode Field Rejection and High Bandwidth (240 kHz)", Mar. 9, 2020, 22 pages.

Allegro MicroSystems Datasheet "Busbar Geometry and Design Techniques for Coreless Acs37610 Differential Current Sensor", Jan. 6, 2021, 11 pages.

Auto Innovations "L'évolution du moteur électrique passe par une meilleure mesure de la position de son rotor", Oct. 2019, 7 pages.

Infineon Datasheet, "TLE4972-AE35D5 high precision coreless current sensor for automotive applications", Dec. 21, 2021, 20 pages.

Infineon Datasheet, "TLE4972-AE35S5 high precision coreless current sensor for automotive applications", Dec. 21, 2021, 20 pages.

Melexis Inspired Engineering; "Current Sensors Reference Design Guide"; Aug. 2016; 27 Pages.

Extended European Search Report dated Jul. 10, 2018 for EP Application No. 18154879.3; 10 Pages.

Response filed on Feb. 22, 2019 for European Application No. 18154879.3; 20 Pages.

Intention to Grant dated Jun. 7, 2019 for European Application No. 18154879.3; 7 Pages.

(56) References Cited

OTHER PUBLICATIONS

Office Action dated Sep. 24, 2019 for U.S. Appl. No. 15/435,725; 25 pages.
Response to Office Action filed Oct. 18, 2019 for U.S. Appl. No. 15/435,725; 13 pages.
Final Office Action dated Jan. 24, 2020 for U.S. Appl. No. 15/435,725; 25 pages.
Response to Final Office Action and Request for Continued Examination (RCE) filed Mar. 31, 2020 for U.S. Appl. No. 15/435,725; 14 pages.
Notice of Allowance dated Jun. 9, 2020 for U.S. Appl. No. 15/435,725; 8 pages.
Office Action dated Jul. 6, 2020 for U.S. Appl. No. 15/999,122; 18 pages.
Office Action dated May 11, 2021 for U.S. Appl. No. 16/841,853, 18 pages.
Response to Office Action filed Jul. 28, 2021 for U.S. Appl. No. 16/841,853, 12 pages.
Notice of Allowance dated Oct. 28, 2021 for U.S. Appl. No. 16/841,853, 9 pages.
U.S. Office Action dated Sep. 14, 2022 for U.S. Appl. No. 17/467,713; 19 pages.
Response to Office Action dated Sep. 14, 2022, filed Nov. 1, 2022 for U.S. Appl. No. 17/467,713; 13 pages.
Notice of Allowance dated Jan. 17, 2023 for U.S. Appl. No. 17/467,713; 11 pages.
PCT Search Report and Written Opinion dated Oct. 31, 2022 for PCT Application No. PCT/US2022/038329; 12 pages.
U.S. Office Action dated Dec. 6, 2022 for U.S. Appl. No. 17/651,080, 18 pages.
Response to U.S. Office Action dated Dec. 6, 2022 filed Mar. 6, 2023 for U.S. Appl. No. 17/651,080, 13 pages.
U.S. Notice of Allowance dated Jul. 21, 2023 for U.S. Appl. No. 17/651,080; 17 pages.
U.S. Notice of Allowance dated Sep. 13, 2023 for U.S. Appl. No. 17/651,080; 11 pages.
Office Action dated Jul. 5, 2023 for U.S. Appl. No. 17/804,654; 16 pages.
Response to Office Action dated Jul. 5, 2023 for U.S. Appl. No. 17/804,654, filed Sep. 15, 2023, 10 pages.
Notice of Allowance dated Nov. 8, 2023 for U.S. Appl. No. 17/804,654, 11 pages.
PCT International Search Report and Written Opinion dated Jan. 9, 2023 for International Application No. PCT/IB2022/059686; 9 Pages.
Office Action dated Nov. 28, 2023, for U.S. Appl. No. 17/695,193, 16 pages.
Response to Office Action dated Nov. 28, 2023, filed Feb. 13, 2024, for U.S. Appl. No. 17/695,193, 7 pages.
Notice of Allowance dated Mar. 7, 2024 for U.S. Appl. No. 17/695,193, 8 pages.
Notice of Allowance dated May 16, 2024 for U.S. Appl. No. 17/695,193, 8 pages.
Extended European Search Report dated Sep. 20, 2024 for European Application No. 24166728.6; 10 pages.
Response to Office Action dated Nov. 20, 2024, filed Jan. 17, 2025 for U.S. Appl. No. 18/300,776, 17 pages.
Gojdka et al. "Biased AMR sensor with monolithically integrated NdFeB magnets" Oct. 2025, 6 pages.

* cited by examiner z

MULTIPLE BRANCH BUS BAR FOR CORELESS CURRENT SENSING APPLICATION

The present application is filed as a Continuation application of U.S. application Ser. No. 17/695,193, filed on Mar. 14, 2022, and entitled: MULTIPLE BRANCH BUS BAR FOR CORELESS CURRENT SENSING APPLICATION, which is herein incorporated by reference in its entirety.

BACKGROUND

As is known, sensors are used to perform various functions in a variety of applications. Some sensors include one or more magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety-critical applications. There are a variety of specifications that set forth requirements related to permissible sensor quality levels, failure rates, and overall functional safety.

SUMMARY

According to aspects of the disclosure, a system is provided, comprising: a conductor having a through-hole and a first notch that are formed therein, the through-hole and the first notch being arranged to define, at least in part, a first branch of the conductor, the through-hole also being arranged to define, at least in part, a second branch of the conductor; and a current sensor that is disposed directly above the first branch of the conductor and to the side of the second branch of the conductor, such that no portion of the current sensor is situated directly above the second branch, wherein the conductor includes a plurality of conductive layers that are embedded in a printed circuit board (PCB), wherein the first branch has a first edge, a second edge, and a central longitudinal axis that is equidistant from the first edge and the second edge, wherein the current sensor includes a first magnetic field sensing element and a second magnetic field sensing element, the first magnetic field sensing element and the second magnetic field sensing element being disposed on opposite sides of the central longitudinal axis, and wherein a width of the first branch is smaller than a width of the through-hole.

According to aspects of the disclosure, a system is provided comprising: a conductor having a through-hole, a first notch, and a second notch that are formed therein, the through-hole and the first notch being arranged to define, at least in part, a first branch of the conductor, the through-hole and the second notch being arranged to define, at least in part, a second branch of the conductor; and a current sensor that is disposed directly above the first branch of the conductor and to the side of the second branch of the conductor, such that no portion of the current sensor is situated directly above the second branch.

According to aspects of the disclosure, a system is provided, comprising: a conductor having a through-hole and a first notch that are formed therein, the through-hole and the first notch being arranged to define, at least in part, a first branch of the conductor, and the through-hole also being arranged to define, at least in part, a second branch of the conductor; and a current sensor that is disposed directly above the first branch of the conductor and the side of the second branch of the conductor, such that no portion of the current sensor is situated directly above the second branch.

BRIEF DESCRIPTION OF THE DRAWINGS

The foregoing features may be more fully understood from the following description of the drawings in which.

DETAILED DESCRIPTION

Figure 1A:
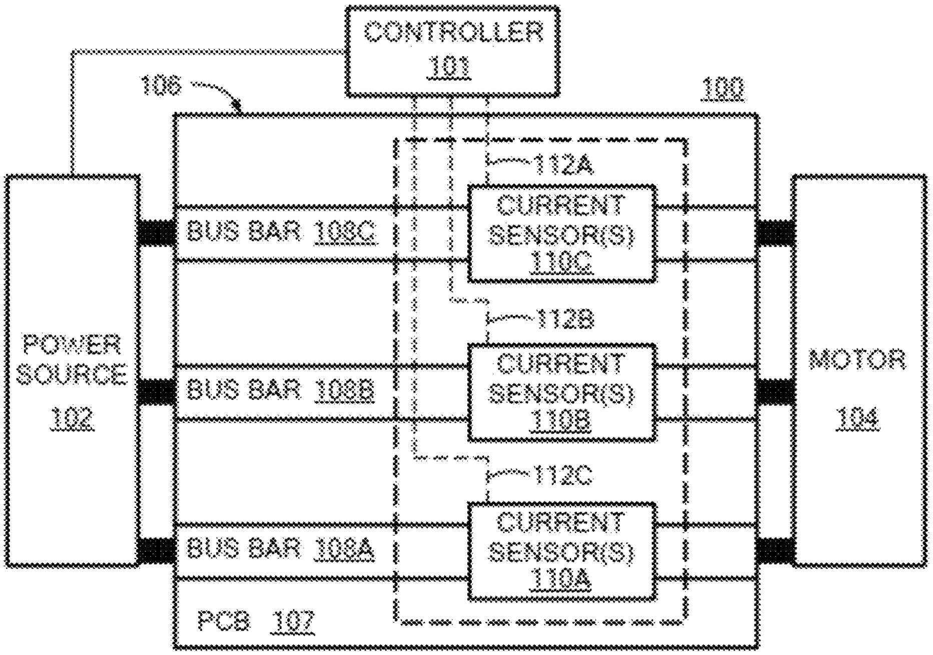
FIG. 1A is a diagram of an example of a system, according to aspects of the disclosure.

FIG. 1A is a diagram of an example of a system 100, according to aspects of the disclosure. As illustrated, the system 100 may include a controller 101 and a power source 102 that is coupled to an electric motor 104 via an interface 106. The interface 106 may include a printed circuit board (PCB) 107. The PCB 107 may include bus bars 108A-C and conductive traces 112A-C formed therein. Each of the conductive traces 112A-C may include one or more metal layers (or layers of another conductive material). Each of the bus bars 108A-C may also include one or more metal layers (or layers of another conductive material). In some implementations, the conductive traces 112A-C may differ in one or more characteristics from the bus bars 108A-C. According to the example of FIG. 1A, each of the bus bars 108A-C may be configured to carry higher currents than any of the conductive traces 112A-C. Additionally or alternatively, in some implementations, each of the bus bars 108A-C may have a larger cross-section than any of the conductive traces 112A-C. Additionally or alternatively, in some implementations, each of the bus bars 108A-C may have a larger width than any of the conductive traces 112A-C.

Each of the bus bars 108A-C may be used to deliver, to the electric motor 104, electrical current that is supplied by the power source 102. The controller 101 may be coupled to current sensors 110A-C via the conductive traces 112A-C. The controller 101 may use the current sensors 110A-C to measure the level of electrical current through the bus bars 108A-C and make adjustments to the operation of the power source 102 in response to the measurements. The controller 101 may use the current sensor 110A to measure the current through bus bar 108A. The controller 101 may use the current sensor 110B to measure electrical current through bus bar 108B. The controller 101 may use the current sensor 110C to measure electrical current through bus bar 108C. Although in the example of FIG. 1A the interface 106 includes three bus bars, alternative implementations are possible in which the interface 106 includes any number of bus bars (e.g., only one bus bar, only two bus bars, five bus bars, etc.). Although in the example of FIG. 1A the interface 106 is used to electrically couple a motor to a power source, it will be understood that the present disclosure is not limited to any specific application of the interface 106.

Figure 1B:
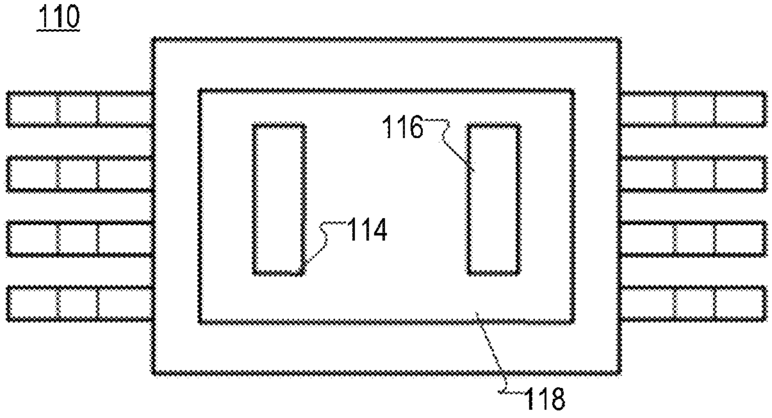
FIG. 1B is a diagram of an example of a current sensor, according to aspects of the disclosure.

FIG. 1B is a diagram of an example of a current sensor 110, according to aspects of the disclosure. The current sensor 110 may be the same or similar to any of the current sensors 110A-C, which are discussed above with respect to FIG. 1A. As illustrated, the current sensor 110 may be a differential current sensor, and it may include magnetic field sensing elements 114 and 116 that are formed on a substrate 118. The magnetic field sensing elements 114 and 116 may be situated on opposite sides of the substrate 118, as shown. According to the present example, each of the magnetic field sensing elements includes a planar Hall effect element. However, alternative implementations are possible in which another type of magnetic field sensing element is used such as a giant magnetoresistor (GMR) or a tunnel magnetoresistor (TMR).

Figure 1C:
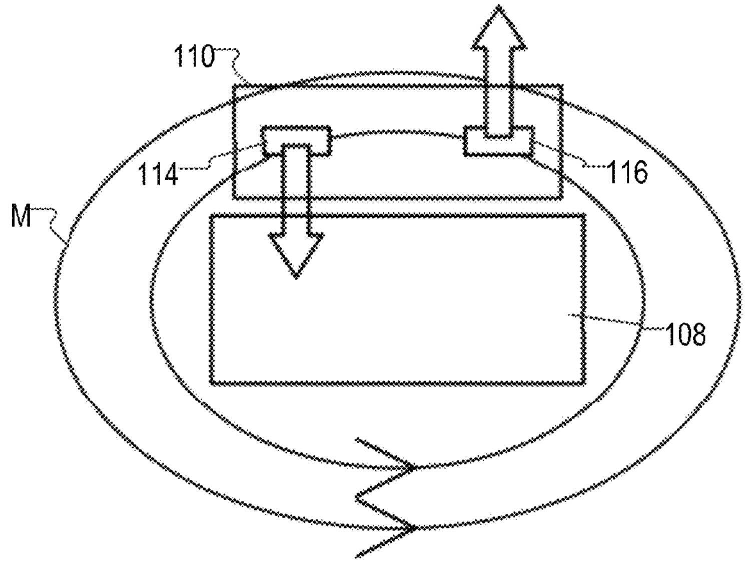
FIG. 1C is a diagram of an example of a current sensor, according to aspects of the disclosure.

FIG. 1C is a diagram illustrating aspects of the operation of the current sensor 110. In the example of FIG. 1C, the current sensor 110 is disposed above a bus bar 108 and configured to perform coreless sensing. The bus bar 108 may be the same or similar to any of the bus bars that are discussed above with respect to FIG. 1A. As noted above, the current sensor 110 may be a differential current sensor. The bus bar 108 may generate a magnetic field M when current flows through it. Magnetic field sensing elements 114 and 116 may sense components of the magnetic field along the same axis (e.g., the Z-axis). However, the components of the magnetic field M that are sensed by magnetic field sensing elements 114 and 116 may have opposite signs due to the magnetic field M being co-axial with the bus bar 108. The output signal that is generated by the current sensor 110 (and which is indicative of the level of current through the bus bar 108) may be generated by subtracting the value sensed by the magnetic field sensing element 114 from the value sensed by the magnetic field sensing element 116. The subtraction may effectively cancel (or reduce the effects of) stray magnetic fields that are incident on the current sensor 110.

Figure 1D:
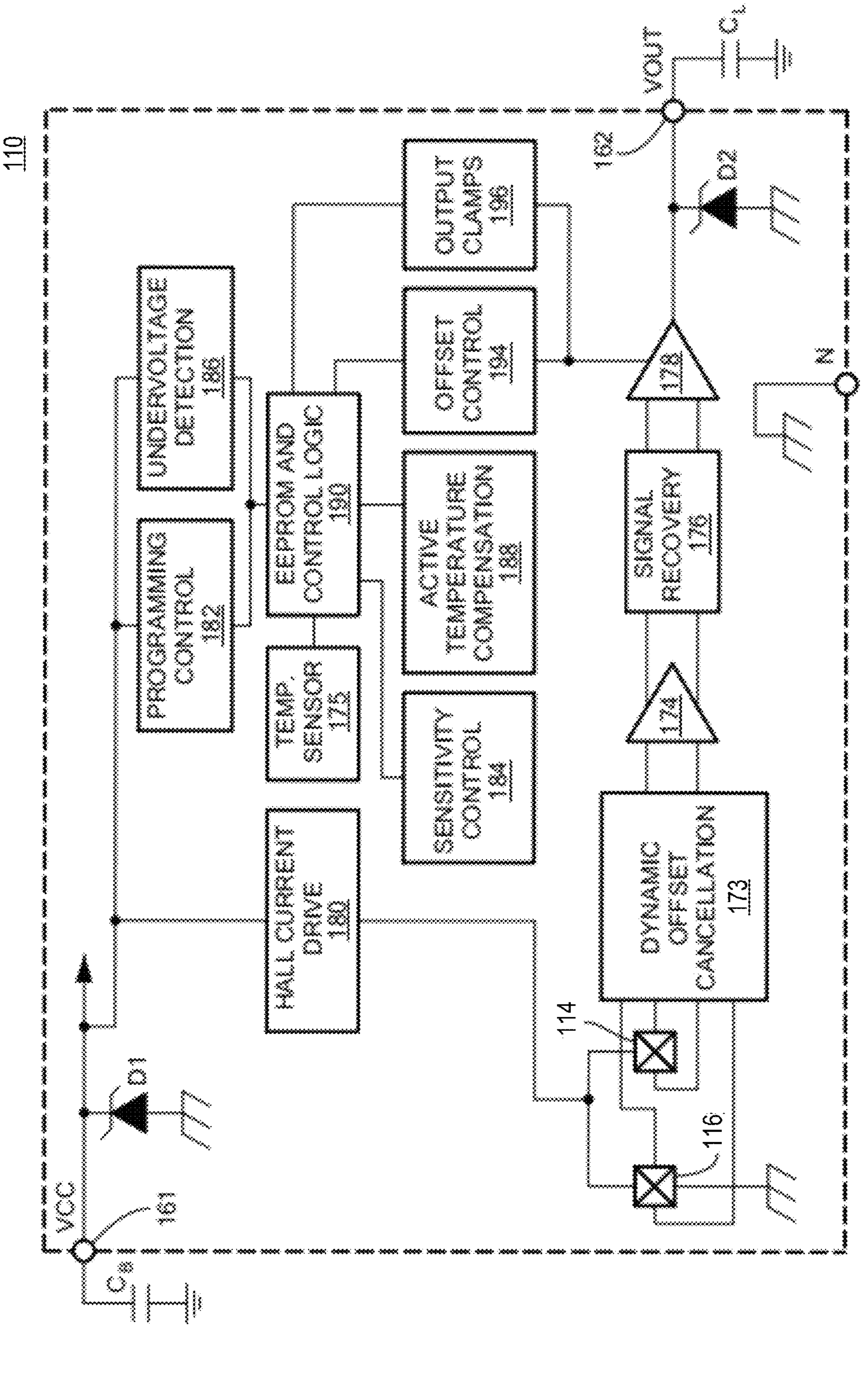
FIG. 1D is a circuit diagram of a current sensor, according to aspects of the disclosure.

FIG. 1D is a circuit diagram illustrating one possible implementation of the electronic circuitry of the current sensor 110.

The current sensor 110 may be configured to perform differential sensing. The current sensor 110 may be configured to output a signal VOUT that is proportional to $\Delta B = B_R - B_L$ where BR represents magnetic field incident on one of the sensing elements and $B_L$ represents magnetic field incident on the other one of the sensing elements. The sensor output VOUT is also affected by the sensitivity, α, of the signal path and can be represented as follows:

$$VOUT = \alpha \times \Delta B \tag{1}$$

The relationship between the conductor current to be measured and the differential field ΔB can be represented by a coupling factor, CF as follows:

$$\Delta B = CF \times I \tag{2}$$

It will be appreciated that coupling factor CF corresponds to coupling between a given current sensor and its proximate conductor and thus, corresponds to what is referred to herein as the intended coupling factor. With such differential sensing architecture, common mode stray fields are rejected.

The current sensor 110 may include a VCC (supply voltage) terminal 161, a VOUT (output signal) terminal 162. The VCC terminal 161 is used for the input power supply or supply voltage for the current sensor 110. A bypass capacitor, $C_B$, can be coupled between the VCC terminal 161 and ground. The VCC terminal 161 can also be used for programming the current sensor 110. The VOUT terminal 162 is used for providing the output signal VOUT to circuits and systems (not shown) such as controller 101 (FIG. 1A) and can also be used for programming. An output load capacitance $C_L$ is coupled between the VOUT terminal 162 and ground. The current sensor 110 can include a first diode DI coupled between the VCC terminal 161 and chassis ground and a second diode D2 coupled between the VOUT terminal 162 and chassis ground.

The driver circuit 180 may be configured to drive the magnetic field sensing elements 114-116. Magnetic field signals generated in the magnetic field sensing elements 114-116 are coupled to a dynamic offset cancellation circuit 173, which is further coupled to an amplifier 174. The amplifier 174 is configured to generate an amplified signal for coupling to the signal recovery circuit 176. Dynamic offset cancellation circuit 173 may take various forms including chopping circuitry and may function in conjunction with offset control circuit 194 to remove offset that can be associated with the magnetic field sensing elements 114-116 and/or the amplifier 174. For example, offset cancellation circuit 173 can include switches configurable to drive the magnetic field sensing elements (e.g., Hall plates) in two or more different directions such that selected drive and signal contact pairs are interchanged during each phase of the chopping clock signal and offset voltages of the different driving arrangements tend to cancel. A regulator (not shown) can be coupled between supply voltage VCC and ground and to the various components and sub-circuits of the current sensor 110 to regulate the supply voltage.

A programming control circuit 182 and an undervoltage detection circuit 186 are coupled between the VCC terminal 161 and EEPROM and control logic circuit 190 to provide appropriate control to the EEPROM and control logic circuit. EEPROM and control logic circuit 190 determines any application-specific coding and can be erased and reprogrammed using a pulsed voltage. A sensitivity control circuit 184 can be coupled to the amplifier 174 to generate and provide a sensitivity control signal to the amplifier 174 to adjust a sensitivity and/or operating voltage of the amplifier 174. An active temperature compensation circuit 188 can be coupled to sensitivity control circuit 184, EEPROM and control logic circuit 190, and offset control circuit 194. The offset control circuit 194 can generate and provide an offset signal to a push/pull driver circuit 178 (which may be an amplifier) to adjust the sensitivity and/or operating voltage of the driver circuit 178. The active temperature compensation circuit 188 can acquire temperature data from EEPROM and control logic circuit 190 via a temperature sensor 175 and perform necessary calculations to compensate for changes in temperature, if needed. Output clamps circuit 196 can be coupled between the EEPROM and control logic circuit 190 and the driver circuit 178 to limit the output voltage and for diagnostic purposes.

Figure 2:
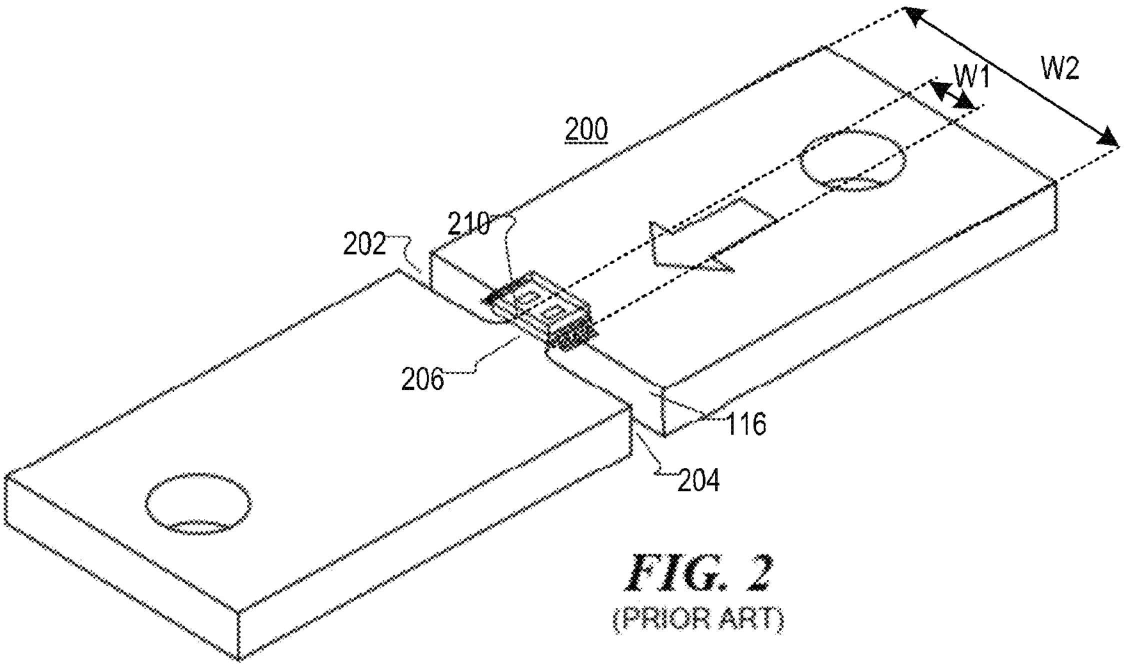
FIG. 2 (PRIOR ART)
FIG. 2 is a diagram of a bus bar, according to aspects of the prior art.

FIG. 2 is a diagram of an example of bus bar 200, according to the prior art. The bus bar 200 may be formed of copper and/or any other suitable type of conductive material. The bus bar 200 may have notches 202 and 204 that are formed therein. Notches 202 and 204 may define a portion 206, as shown. Portion 206 may have a width W1 that is smaller than the width W2 of the rest of the bus bar 200. A current sensor 210 may be disposed above portion 206, as shown. While the design of the bus bar 200 works well with a medium current range (e.g., less than 500 A), the presence of notches 202 and 204 significantly increases the bus bar resistance and introduces additional heat loss. The presence of notches 202 and 204 may further compromise AC performance when the notches 202 and 204 are deeper than 3 mm. In addition, the presence of notches 202 and 204 may result in decreased mechanical robustness of the bus bar 200 and thermal effect.

FIGS. 3A-E show an example of a bus bar 300, according to aspects of the disclosure. In some respects, the bus bar 300 may have a higher mechanical and thermal robustness than the bus bar 200, while achieving similar performances over frequency.

Figure 3A:
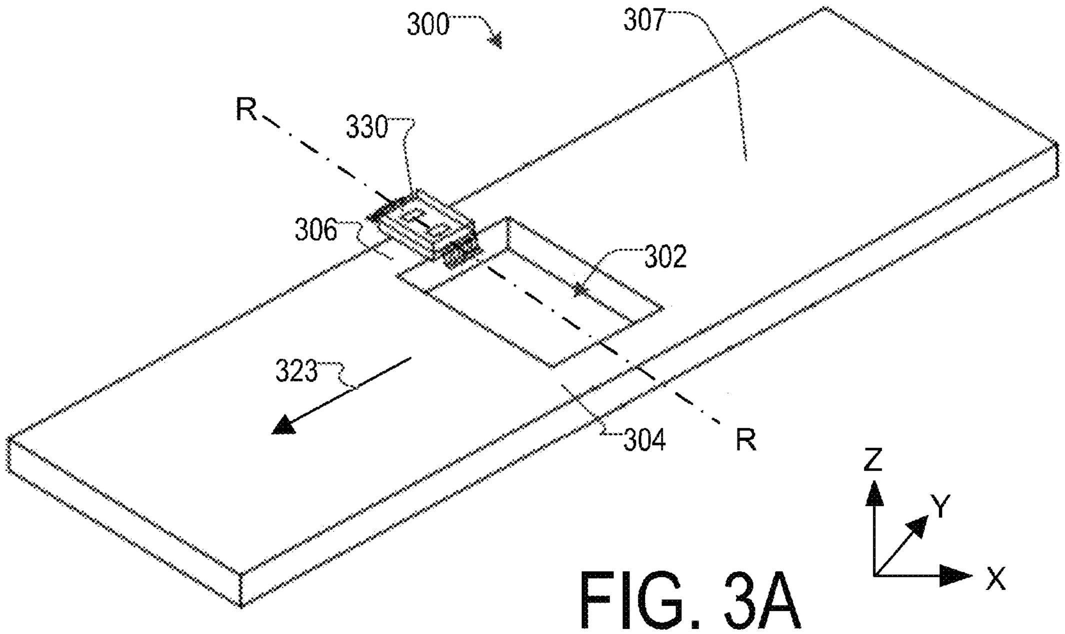
FIG. 3A is perspective view of a system including a bus bar and current sensor, according to aspects of the disclosure.
Figure 3B:
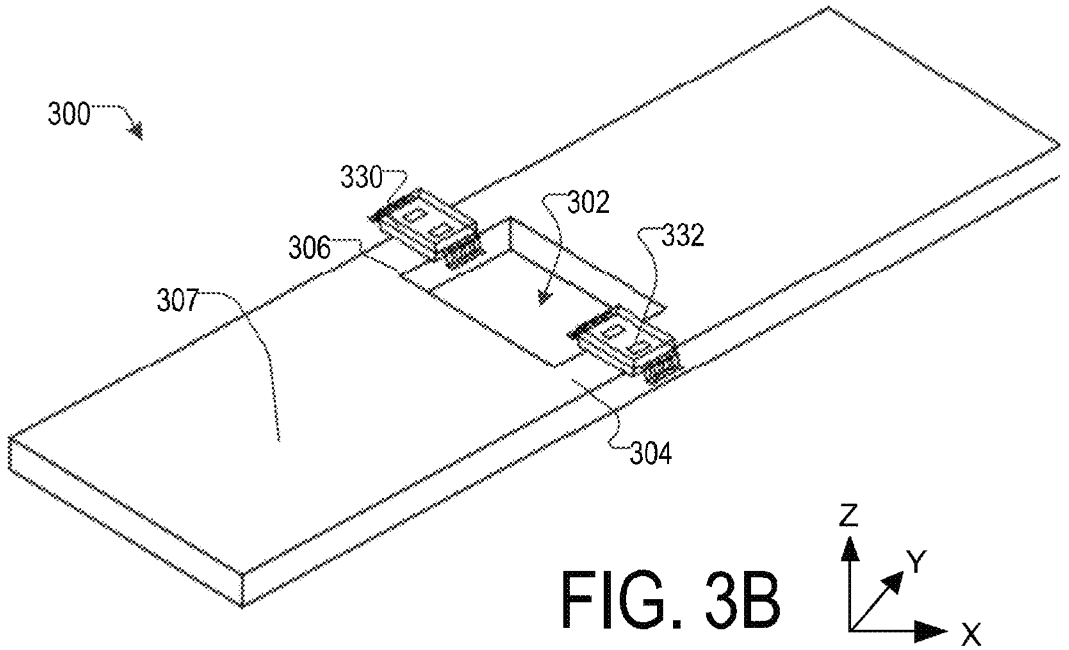
FIG. 3B is perspective view of a system including a bus bar and a plurality of current sensors, according to aspects of the disclosure.
Figure 3C:
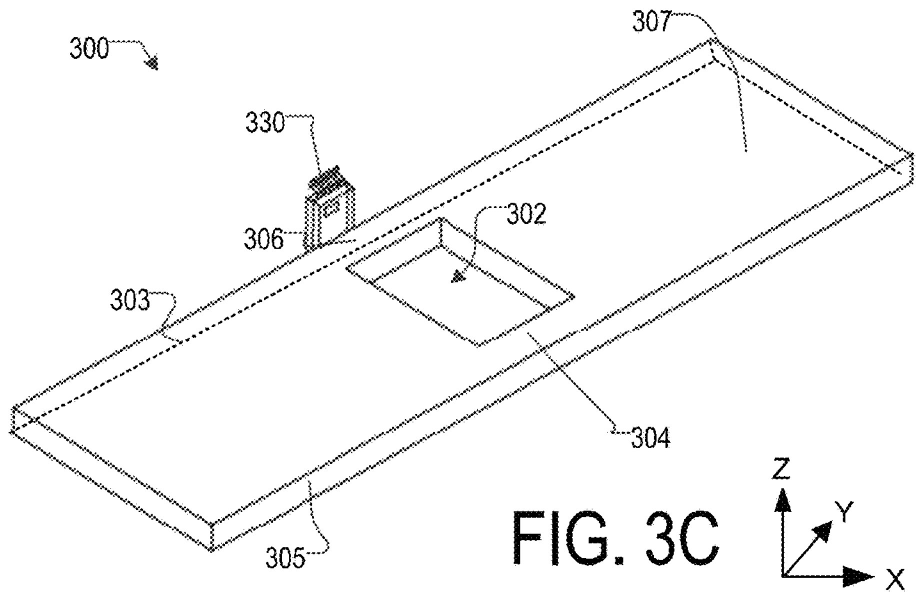
FIG. 3C is perspective view of a system including a bus bar and a sensor, according to aspects of the disclosure.

As illustrated, the bus bar 300 may have an aperture 302 (e.g., a through-hole) formed therein. The bus bar 300 may have a main surface 307, and edges 303 and 305 (shown in FIG. 3C-E). The bus bar 300 may have a width W, a length L, and thickness T (e.g., see FIGS. 3D-E). When in use, electrical current may flow in the bus bar 300 in the direction shown by arrow 323. As illustrated in FIG. 3A, a current sensor 330 may be mounted over branch 306, as shown. In this example of FIG. 3A, the sensor 330 is arranged to face the main surface 307 of the bus bar 300 and sense the Z-axis component of the magnetic field that is generated in branch 306. As illustrated in FIG. 3B, the sensor 330 may be mounted over branch 306 and a current sensor 332 may be mounted over branch 304. In this example of FIG. 3B, the sensors 330 and 332 are arranged to face the main surface 307 of the bus bar 300. In this arrangement, the sensors 330 and 332 may both sense the respective Z-axis components of the magnetic fields that are generated in branches 306 and 304, respectively. In the example of FIG. 3C, the sensor 330 may be disposed adjacent to branch 306 and arranged to face the edge 303 of the busbar 300. In this arrangement, the sensor 330 may sense the X-axis component of the magnetic field that is generated in branch 306. In some implementations, each of the sensors 330 and 332 may be the same or similar to the current sensor 110, which is discussed above with respect to FIG. 1D.

In some respects, a magnetic field sensor may be arranged to face a main surface of a bus bar or face the bus bar's edge. FIGS. 3A-B illustrate examples in which sensors 330 and/or 332 are arranged to face the main surface of the bus bar 300. FIG. 3C illustrates an example in which the sensor 330 is arranged to face an edge of the bus bar 300. In some implementations, a magnetic field sensor may be arranged to face a main surface of a bus bar, when the substrate of the magnetic field sensor is substantially parallel to the main surface. Additionally or alternatively, in some implementations, a magnetic field sensor may be arranged to face a main surface of a bus bar, when the axis of maximum sensitivity of the magnetic field sensor is substantially parallel to the main surface. In some implementations, a magnetic field sensor may be arranged to face an edge of a bus bar, when the substrate of the magnetic field sensor is substantially perpendicular to the main surface. Additionally or alternatively, in some implementations, a magnetic field sensor may be arranged to face an edge of a bus bar, when the axis of maximum sensitivity of the magnetic field sensor is substantially perpendicular to the main surface.

Figure 3D:
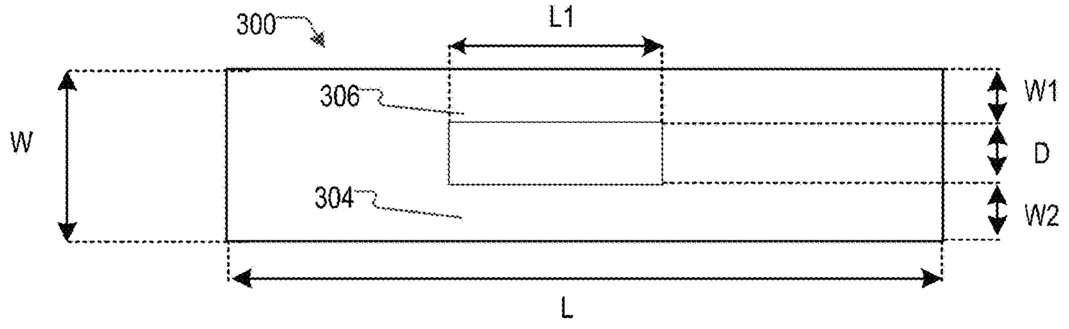
FIG. 3D is a planar top-down view of a bus bar, according to aspects of the disclosure.
Figure 3E:
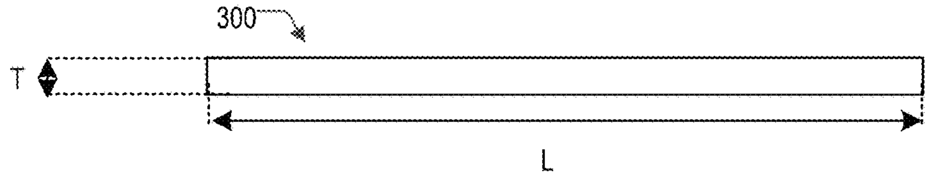
FIG. 3E is a planar side view of a bus bar, according to aspects of the disclosure.
Figure 4A:
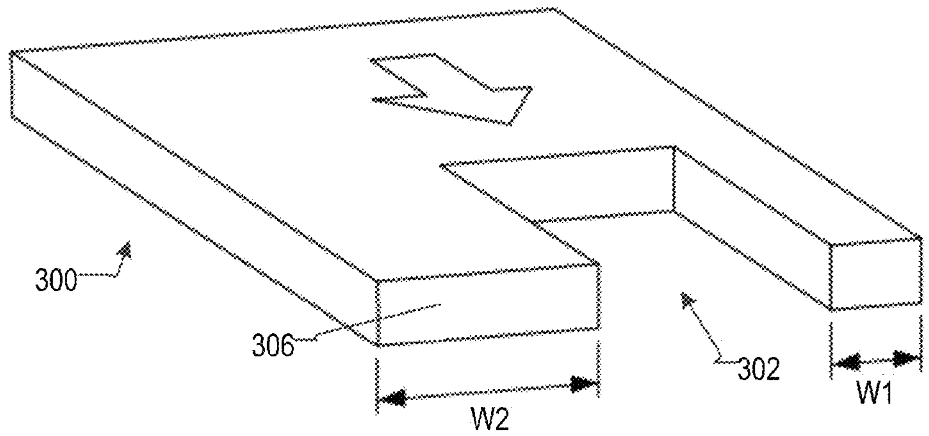
FIG. 4A is a perspective cross-sectional view of a bus bar, according to aspects of the disclosure.
Figure 4B:
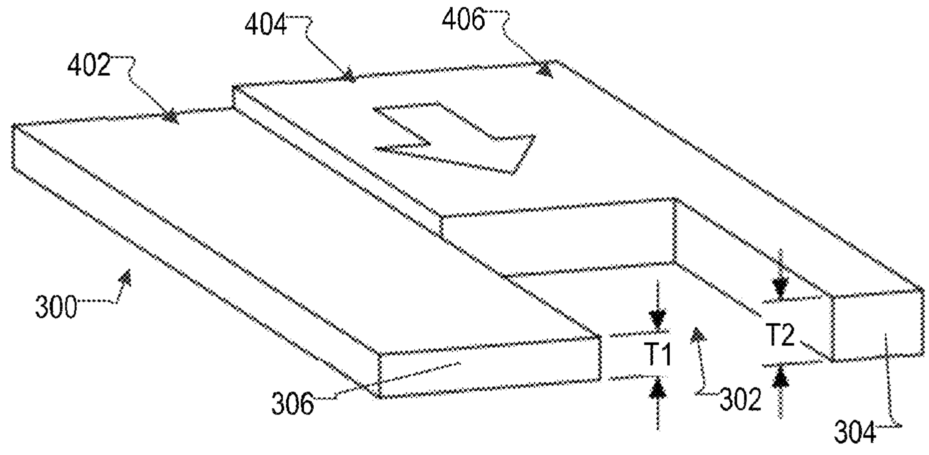
FIG. 4B is a perspective cross-sectional view of a bus bar, according to aspects of the disclosure.
Figure 5A:
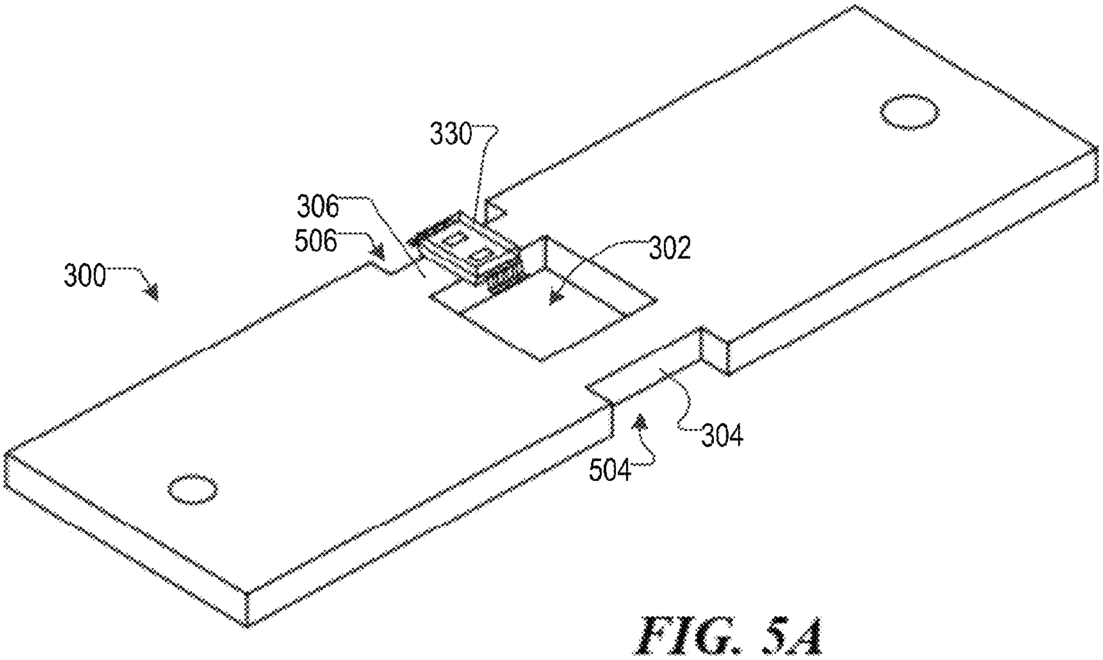
FIG. 5A is a perspective view of a system including a bus bar and a current sensor, according to aspects of the disclosure.
Figure 5B:
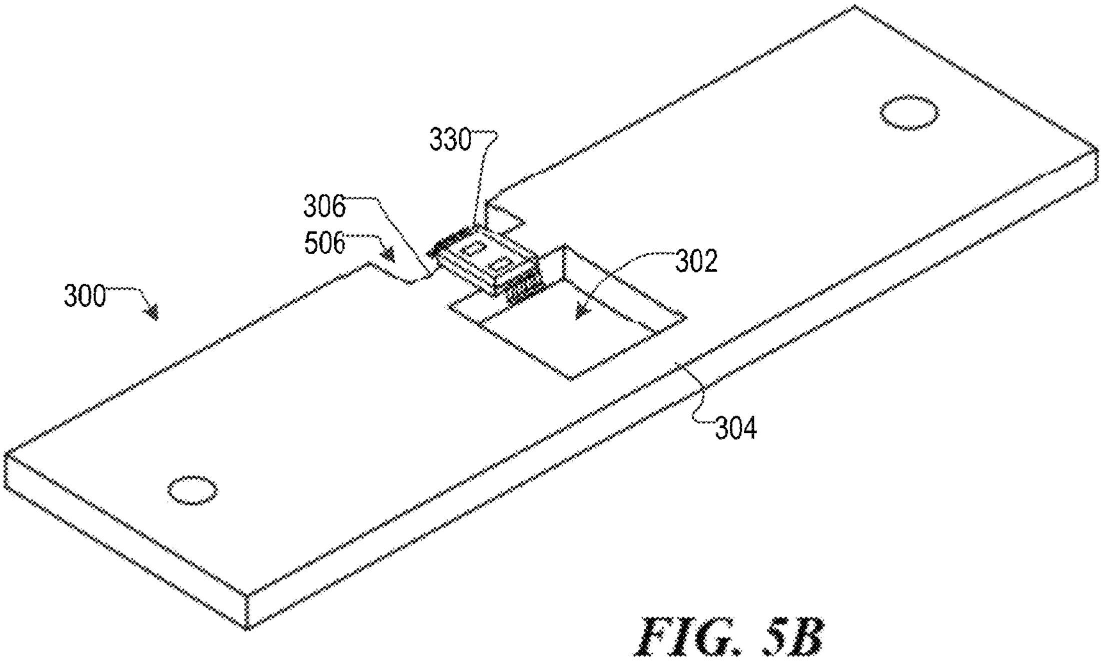
FIG. 5B is a perspective view of a system including a bus bar and a current sensor, according to aspects of the disclosure.
Figure 10A:
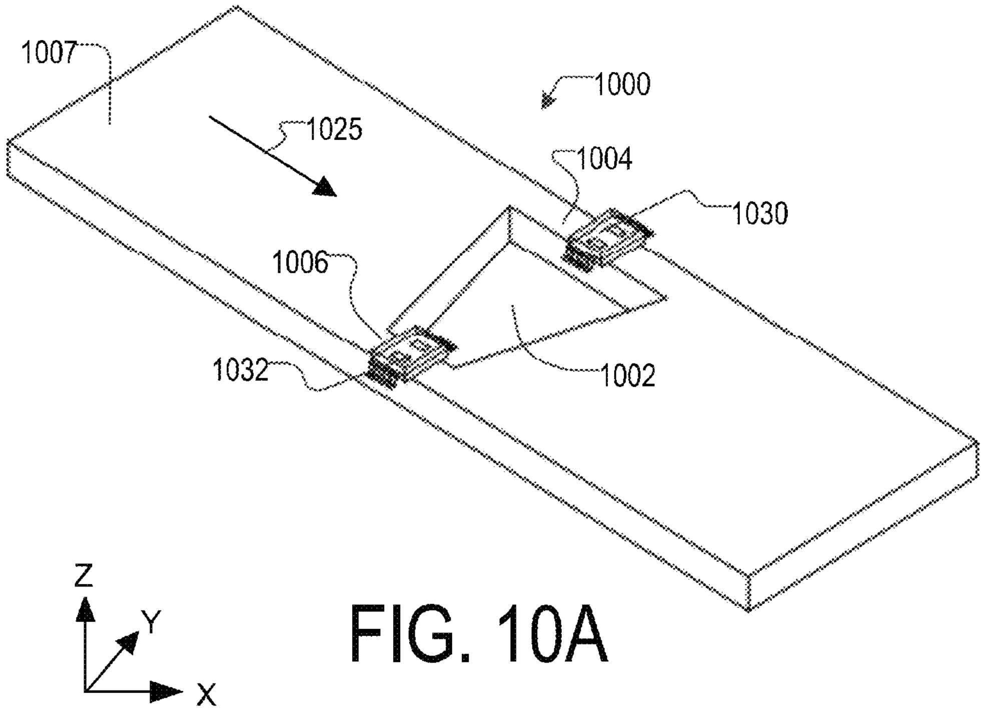
FIG. 10A is a perspective view of a system including a bus bar and a current sensor, according to aspects of the disclosure.
Figure 10B:
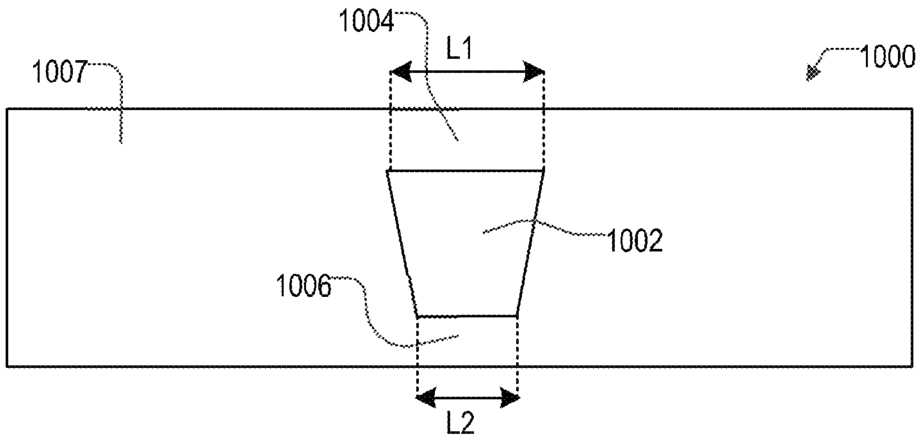
FIG. 10B is a top-down view of a bus bar, according to aspects of the disclosure.

FIG. 3D illustrates that: (i) branch 306 may have a width W1 and length L1, (ii) branch 304 may have a width W2 and length L1, and (iii) the aperture 302 may have a width D and length L1. In some implementations, the width W1 may be equal to the width W2. In some instances, maintaining a ratio W1/W2=1 provides the best frequency behavior as the current through the bus bar 300 is split evenly between branches 304 and 306. However, alternative implementations are possible in which the widths of branches 304 and 306 are different. For example, as indicated by FIGS. 5A-B, the widths of branches 304 and 306 may be adjusted by forming notches into branches. In some implementations, the relative widths of branches 304 and 306 may be selected to achieve desired magnetic coupling coefficients for branches 304 and 306. As another example, as indicated by FIGS. 10A-B, branches 304 and 306 may have different lengths (e.g., by imparting a trapezoidal shape on the aperture 302). In some implementations, the relative lengths of branches 304 and 306 may be selected to achieve desired magnetic coupling coefficients for branches 304 and 306. As another example, as indicated by FIGS. 4A-B, branches 304 and 306 may have different thicknesses. In some implementations, the relative thicknesses of branches 304 and 306 may be selected to achieve desired magnetic coupling coefficients for branches 304 and 306 or a desired response over frequency for branches 304 and 306.

As noted above with respect to FIG. 3D, maintaining equal branch sizes in the busbar 300 may ensure that the busbar 300 would have a best frequency behavior. The best frequency behavior corresponds to the busbar 300 having (as much as possible) a constant gain and phase over frequency, as well as a fast response time to current. On the other hand, when different branch sizes are used in a busbar, the current through the busbar would be split unevenly between the branches causing uneven system sensitivity. Having different sizes would cause the branches to have different current density distributions over frequency, and different magnetic coupling coefficients as a result.

In some implementations, the bus bar 300 may have the following dimensions: T=3 mm, W1=3 mm, D=12 mm, W2=3 mm, and L=2 mm. In such implementations, the bus bar 300 may have a DC coupling factor of 171 mG/A, and the resistance of bus bar 300 may increase by 8.7 μOhm over a conventional bus bar design (e.g., a design in which the bus bar is a rectangular metal plank lacking an aperture). By comparison, a bus bar 200 of similar dimensions (shown in FIG. 2) may have a DC coupling factor of 367 mG/A, and a resistance increase of 20.1 μOhm. In other words, the design of the bus bar 300 may have a lower magnetic coupling factor and a lower resistance than the bus bar 200.

Figure 3F:
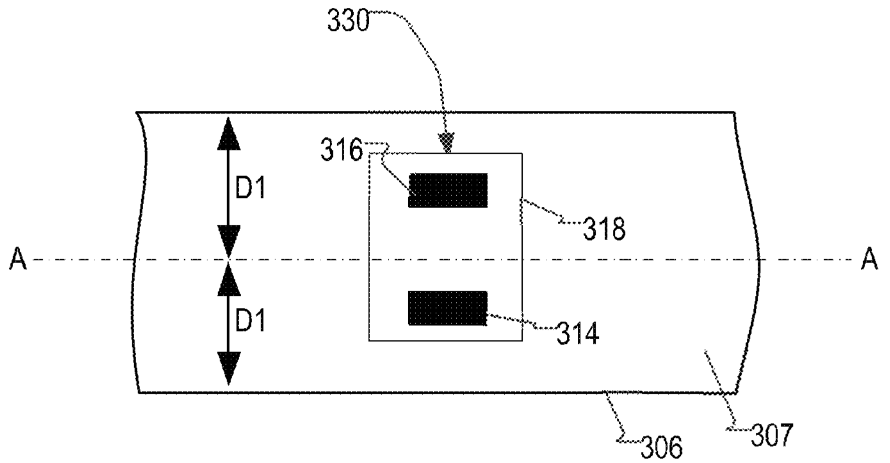
FIG. 3F is a partial top-down view of a system including a bus bar and a current sensor, according to aspects of the disclosure.

FIG. 3F illustrates in further detail the positioning of the sensor 330 when the sensor 330 is arranged to face the main surface 307 of branch 306 and/or the bus bar 300. As illustrated, the sensor 330 may include sensing elements 314 and 316 that are formed on a substrate 318. The sensing elements 314 and 316 may be the same or similar to the sensing elements 114 and 116, which are discussed above with respect to FIG. 1B. The substrate 318 may be the same or similar to the substrate 118, which is discussed above with respect to FIG. 1B. Branch 306 may have a central axis A-A. The central axis A-A may be separated by a distance D1 from each of the sides of branch 306. The sensor 330 may be positioned above branch 306, such that the sensing elements 314 and 316 are on opposite sides of the central axis A-A. In some implementations, the distance between the sensing element 314 and the central axis A-A may be the same or similar to the distance between the sensing element 316 and the central axis A-A. In some implementations, there may be an air gap (e.g., 2 mm) between the sensor 330 and the main surface 307.

Figure 3G:
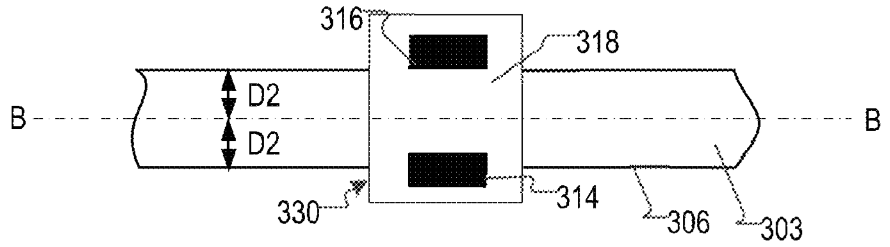
FIG. 3G is a partial side view of a system including a bus bar and a current sensor, according to aspects of the disclosure.

FIG. 3G illustrates in the further detail the positioning of the sensor 330 when the sensor 330 is arranged to face the edge 303 of branch 306 and/or the bus bar 300. The edge 303 may have a central axis B-B. The central axis B-B may be separated by a distance D2 from each of the sides of the edge 303. The sensor 330 may be positioned adjacent to branch 306, such that the sensing elements 314 and 316 are on opposite sides of the central axis B-B. In some implementations, the distance between the sensing element 314 and the central axis B-B may be the same or similar to the distance between the sensing element 316 and the central axis B-B. In some implementations, there may be an air gap (e.g., 2 mm) between the sensor 330 and edge 303.

The mounting of the sensor 330 in FIG. 3F may be referred to as horizontal mounting, and the mounting of the sensor in FIG. 3G may be referred to as vertical mounting. The sensor 330 may use either Surface Mount Device (SMD) packaging or System-In-Package (SIP) packaging. Either type of packaging can be used irrespective of whether the sensor 330 is mounted using vertical mounting or horizontal mounting.

Figure 4C:
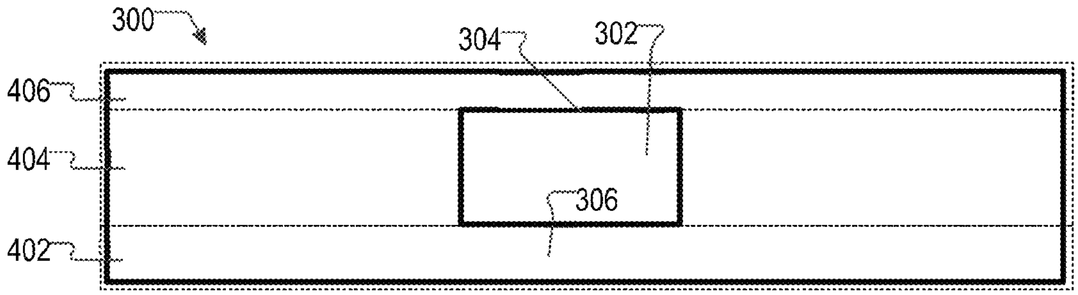
FIG. 4C is a top-down view of a bus bar, according to aspects of the disclosure.

In the example of FIGS. 3A-F, the bus bar 300 has a uniform thickness. However, alternative implementations are possible in which the bus bar 300 has a non-uniform thickness. FIG. 4A illustrates an example of an implementation in which the bus bar 300 has a uniform thickness. FIG. 4A is a cross-sectional view of the bus bar along axis R-R (shown in FIG. 3A). FIGS. 4B-C show an example of another implementation in which the bus bar 300 has a non-uniform thickness. FIG. 4B is a cross-sectional view of the bus bar 300 along axis R-R and FIG. 4C is a top-down planar view of the bus bar 300. As illustrated, the bus bar 300 may include side portions 402 and 406, and a middle portion 404. In some implementations, the side portion 402 may have thickness T1, while the side portion 406 and the middle portion 404 have a thickness T2, where T2>T1. In this arrangement, branch 304 may have a greater thickness than branch 306. In some implementations, the thicknesses of branches 304 and 306 (and/or lengths) may be selected to maintain an equivalent impedance between branches 304 and 306 (e.g., when branches have differing widths) and better adjust their coupling factors, current density, and skin effect.

In some implementations, in the example of FIG. 3B, the sensors 330 and 332 may be configured to take redundant measurements of the current through the bus bar 300. Such redundant measurement may be a key requirement for achieving a high Automotive Safety Integrity Level (ASIL) rating and/or advanced diagnostic of the current measurement.

FIG. 5A illustrates another implementation of the bus bar 300. In this implementation, the bus bar 300 is provided with notches 504 and 506 on opposite sides of the aperture 302. Providing the notches 504 and 506 results in the respective widths of branches 304 and 306 being further reduced. FIG. 5B illustrates another implementation of the bus bar 300. In this implementation, the bus bar 300 is provided with a notch 506 on one side of the aperture 302 while no notch is provided on the other side of the aperture 302.

Figure 6A:
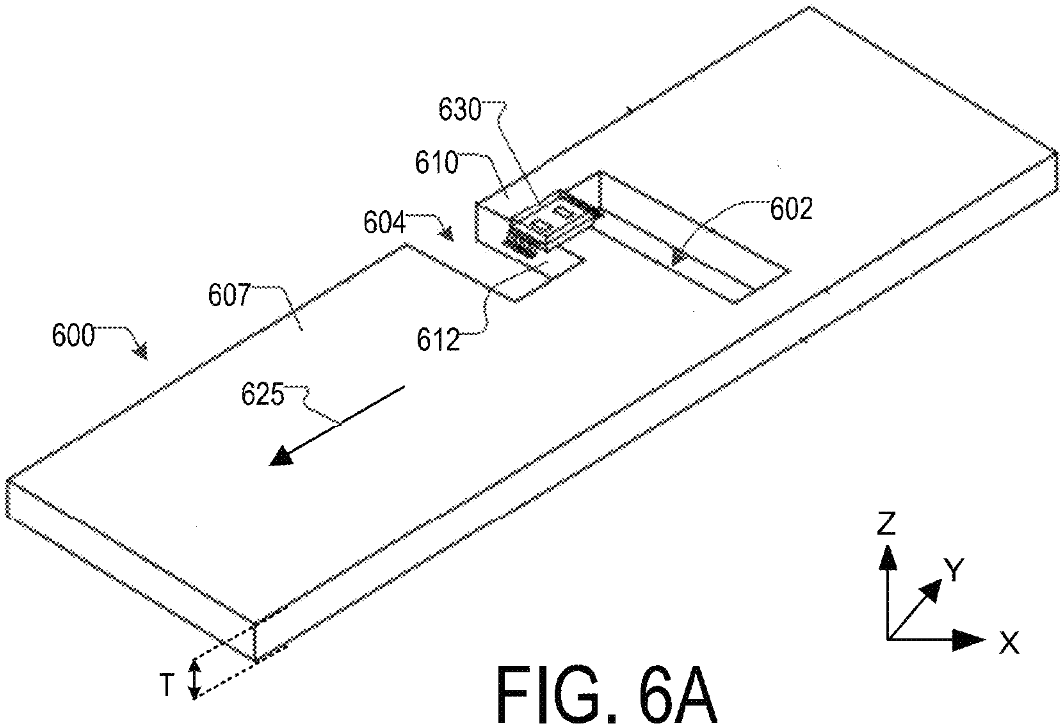
FIG. 6A is a perspective view of a system including a bus bar and a current sensor, according to aspects of the disclosure.
Figure 6B:
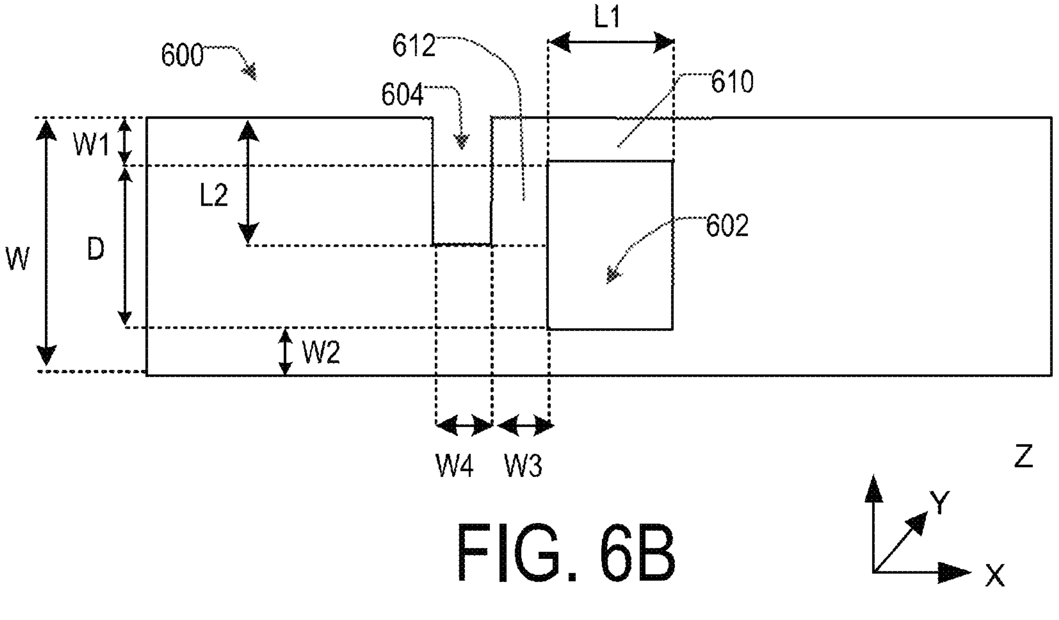
FIG. 6B is a top-down view of a bus bar, according aspects of the disclosure.

FIG. 6A-B show an example of a bus bar 600, according to aspects of the disclosure. In the example of FIGS. 6A-B, the bus bar 600 forms an angle to rotate the measuring position of a current sensor 630 and achieve high cross-talk immunity with respect to adjacent bus bars.

The bus bar 600 may have an aperture 602 (e.g., a through-hole) formed therein and a notch 604. The aperture 602 may define a branch 610. In addition, the aperture 602, together with the notch 604 may define a branch 612. At least a portion of branch 612 may be situated between the notch 604 and the aperture 602, as shown. Branch 610 may have a length L1 and branch 612 may have a length L2 that is greater than the length L1. Although in the present example the length of branch 612 is greater than the length of branch 610, alternative implementations are possible in which branch 612 has a greater length or both branches have the same length. When in use, electrical current may flow in the bus bar 600 in the direction shown by arrow 625.

As illustrated, branch 610 may be transverse (e.g., perpendicular) to branch 612. A sensor 630 may be positioned over branch 612. The sensor 630 may be arranged to face a main surface 607 of the bus bar 600. The sensor 630 may be the same or similar to the current sensor 110, which is discussed above with respect to FIG. 1D. As can be readily appreciated, when the bus bar 600 is in use, electrical current may flow through branch 612 in a direction that is transverse (e.g., perpendicular) to the direction in which current flows through the rest of bus bar 600 (i.e., the direction shown by arrow 625). In the arrangement shown in FIG. 6A, the sensor 630 may measure the current through branch 612. In the example of FIG. 6A, the sensor 630 is configured to sense the Z-axis component of the magnetic field generated in branch 612.

Figure 6C:
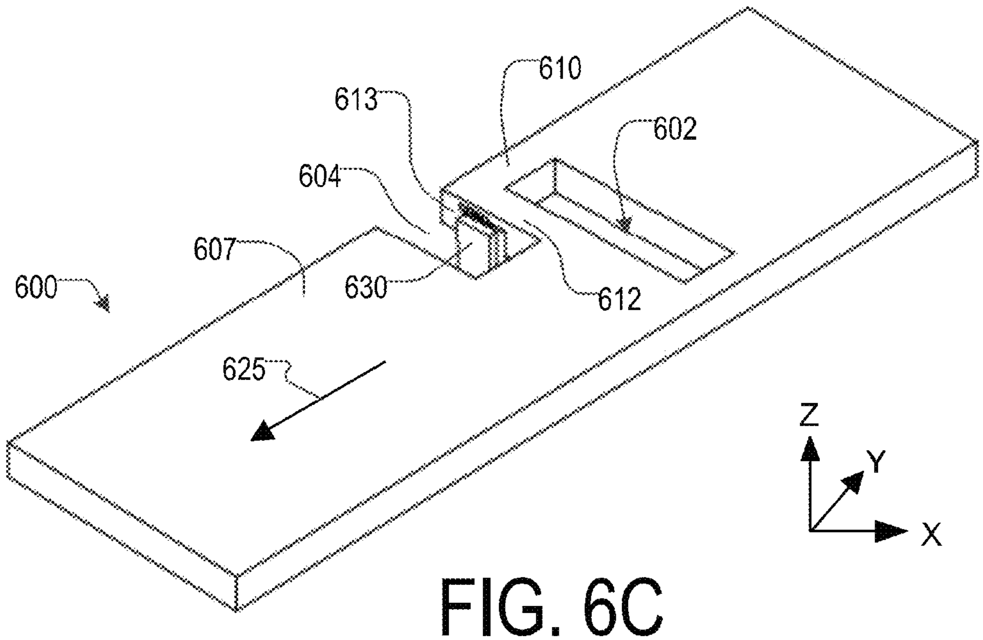
FIG. 6C is a perspective view of a system including a bus bar and a current sensor, according to aspects of the disclosure.
Figure 6D:
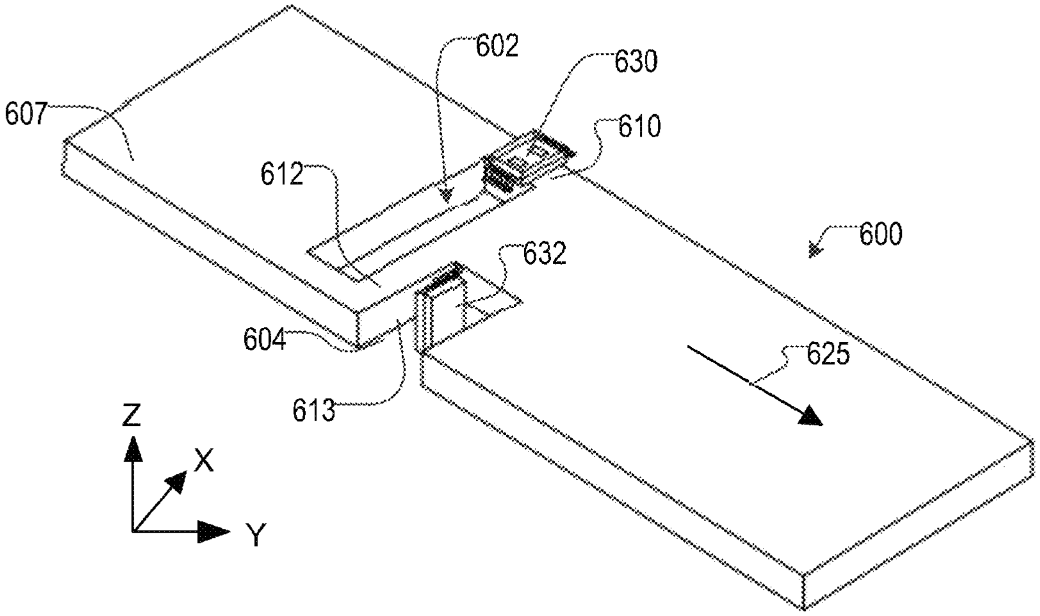
FIG. 6D is a perspective view of a system including a bus bar and a plurality of current sensors, according to aspects of the disclosure.

In the example of FIG. 6A, the sensor 630 is arranged to face the main surface 607 of the bus bar 600 and/or branch 612. However, FIG. 6C shows an alternative implementation in which the sensor 630 is arranged to face an edge 613 of the bus bar 600 and/or branch 612. In the example of FIG. 6C, the sensor 630 is arranged to sense the Y-axis component of the magnetic field generated in branch 612. FIG. 6D shows another implementation in which the sensor 630 is supplemented by a current sensor 632. In the example of FIG. 6D, the sensor 632 is arranged to face the edge 613 of branch 612 (and/or bus bar 600), and the sensor 630 is arranged to face the main surface 607 of branch 610 (and/or the bus bar 600). In the example of FIG. 6D, the sensor 630 is arranged to sense the Z-axis component of the magnetic field generated in branch 610, and the sensor 632 is arranged to sense the Y-axis component of the magnetic field generated in branch 612. As can be readily appreciated, the geometry of the bus bar 600 may provide sensor 632 with increased crosstalk immunity with respect to branch 610. The cross-talk immunity may be achieved as a result of the geometry of the busbar 600 enabling the sensor 632 to be positioned in a way in which the sensing orientation of the sensor 632 inhibits (or ideally precludes) the sensor 632 from sensing magnetic fields originating from the branch 610.

As illustrated in FIG. 6B, in some implementations, the bus bar 600 may have a width W=18 mm and a thickness T=3 mm. The notch 604 may have a width W4=6 mm and a length L2=6 mm. Branch 612 may have a width W3=3 mm and length L2=6 mm. The aperture 602 may have a length D=12 mm and a width L1=6 mm. Branch 610 may have a length L1=6 mm and width W1=3 mm. It will be understood that the foregoing dimensions are provided for reference purposes only, and the present disclosure is not limited to any specific set of dimensions for the bus bar 600.

Figure 7A:
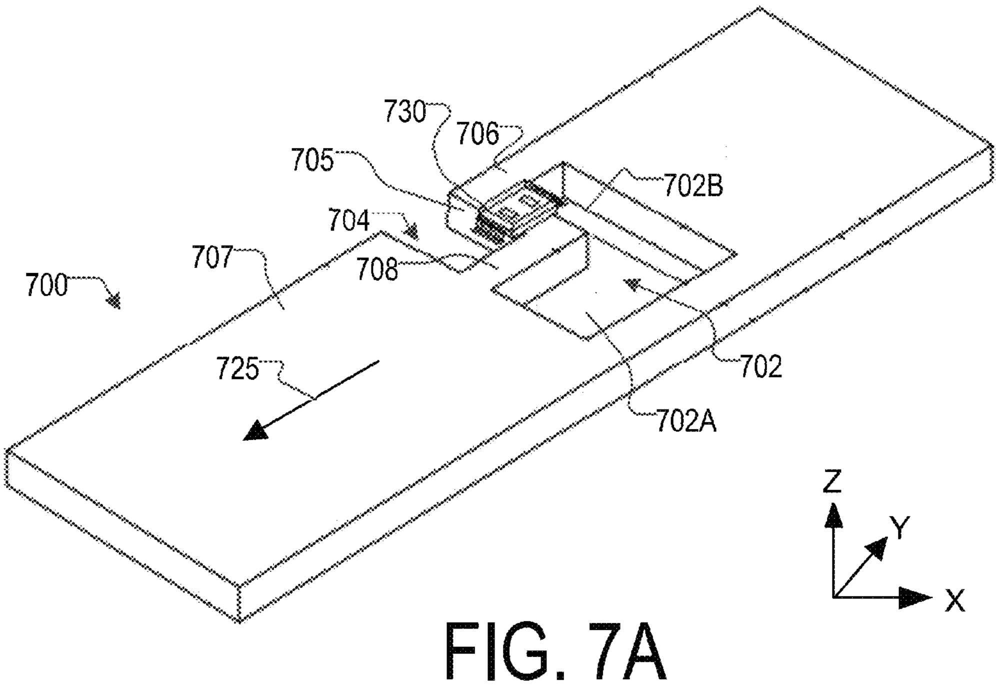
FIG. 7A is a perspective view of a system including a bus bar and a current sensor, according to aspects of the disclosure.
Figure 7B:
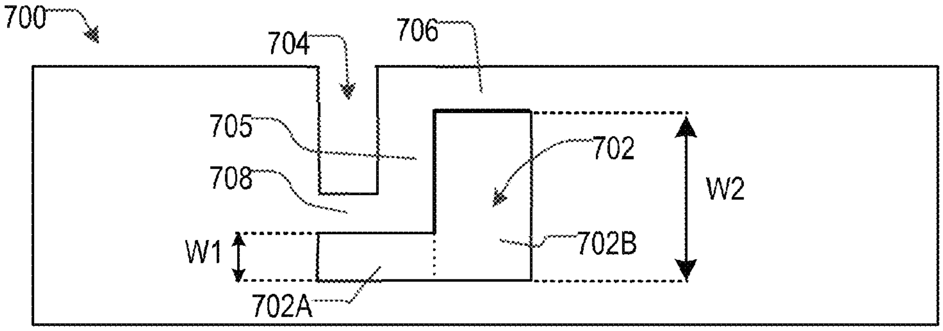
FIG. 7B is a top-down view of a bus bar, according to aspects of the disclosure.

FIGS. 7A-B show an example of a bus bar 700, according to aspects of the disclosure. As illustrated bus bar 700 may have an aperture 702 (e.g., a through-hole) formed therein and a notch 704. The aperture 702 may be L-shaped, and it may have portions 702A and 702B. Portion 702A may have a width W1 and portion 702B may have a width W2 that is greater than the width W1. The aperture 702 and the notch 704 may define branches 706, 705, and 708. Branches 708 and 706 may be substantially parallel to each other and branch 705 may be transverse (e.g., perpendicular) to branches 708 and 706. When in use, electrical current may flow through the bus bar 700 in the direction shown by arrow 725. A current sensor 730 may be placed over a main surface 707 of branch 705 (and/or the bus bar 700). In the example of FIG. 7A, the sensor 730 is arranged to sense the Z-axis component of the magnetic field generated in branch 705. The sensor 730 may be the same or similar to the current sensor 110, which is discussed above with respect to FIG. 1D.

Figure 8A:
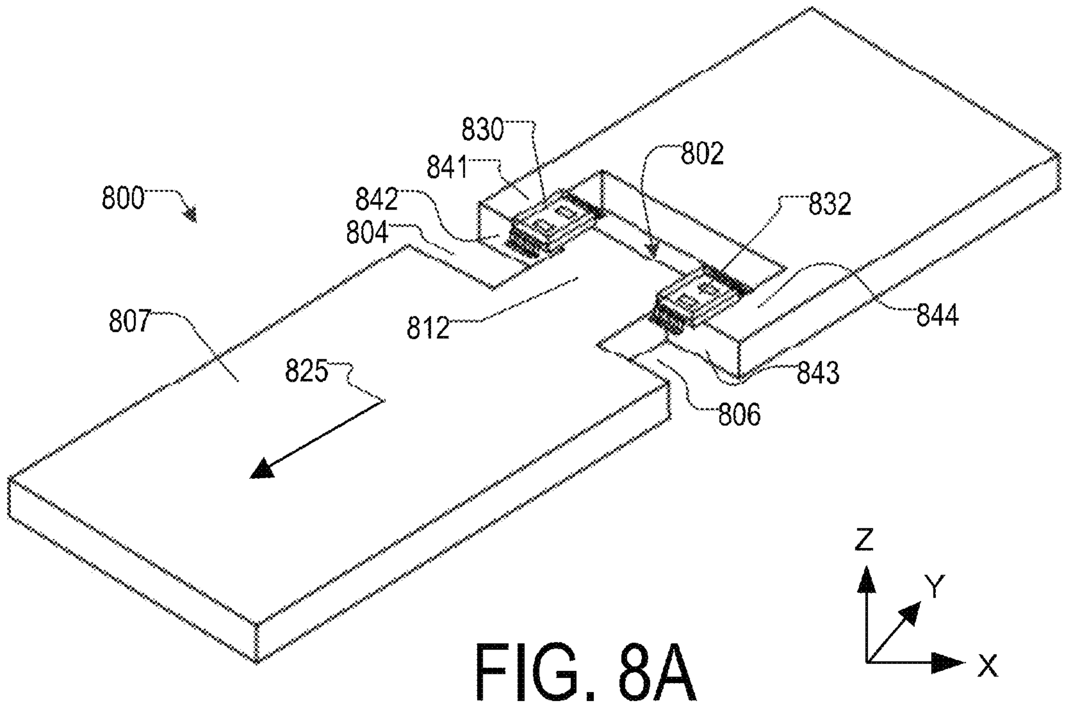
FIG. 8A is a perspective view of a system including a bus bar and a current sensor, according to aspects of the disclosure.
Figure 8B:
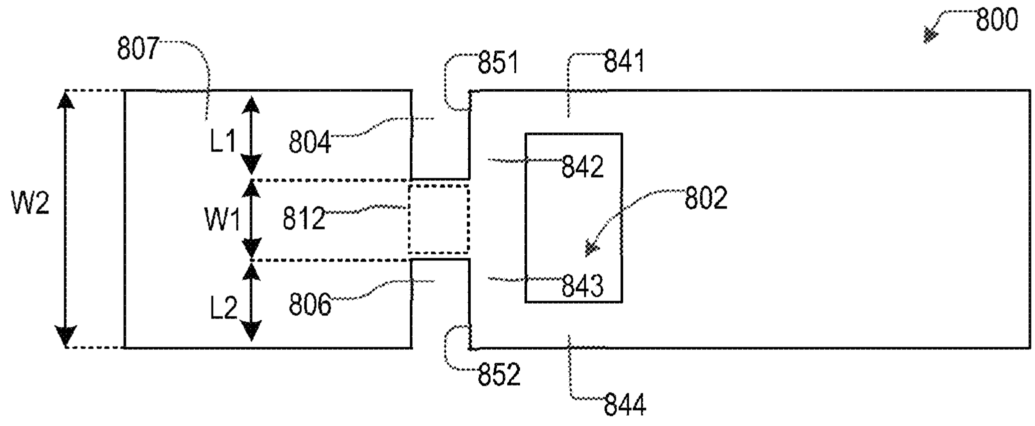
FIG. 8B is a top-down view of a bus bar, according to aspects of the disclosure.

FIGS. 8A-B show an example of a bus bar 800, according to aspects of the disclosure. As illustrated, the bus bar 800 may have an aperture 802 (e.g., a through-hole) formed therein. In addition, the bus bar 800 may have notches 804 and 806 formed adjacent to the aperture 802. The aperture 802 and the notches 804-806 may define branches 841-844. Branches 841 and 842 may be transverse (e.g., perpendicular) to each other. Branches 843 and 844 may be transverse (e.g., perpendicular) to each other, as well. A narrow portion 812 may be formed between the notches 804 and 806. Portion 812 may have a width WI and the rest of the bus bar 800 may have a width W2 that is greater than the width W1. When in use, electrical current may flow through the bus bar 800 in the direction shown by arrow 825. A current sensor 830 may be placed over branch 842 and a current sensor 832 may be placed over branch 843. The sensor 830 may be arranged to face a main surface 807 of branch 842 and/or the bus bar 800. The sensor 832 may be arranged to face the main surface 807 of branch 843 and/or the bus bar 800. Each of the sensors 830 and 832 may be the same or similar to the current sensor 110, which is discussed above with respect to FIG. 1D.

Figure 8C:
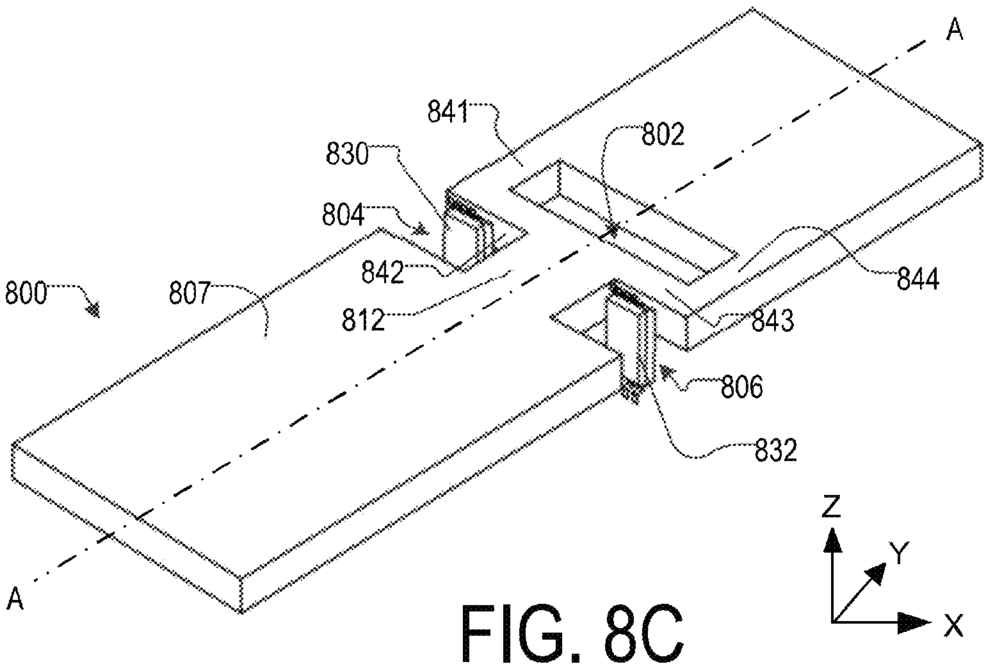
FIG. 8C is a perspective view of a system including a bus bar and a plurality of current sensors, according to aspects of the disclosure.

In the example of FIG. 8A, the sensors 830 and 832 are arranged to face the main surface 807 of branches 842-843 and/or the bus bar 800. However, FIG. 8C shows an alternative implementation in which the sensors 830 and 832 are arranged to face the edges 851 and 852 (shown in FIG. 8B) of branches 842 and 843, respectively. In some implementations, branch 842 may have a length L1 and branch 843 may have a length L2 that is equal to the length L1, and they may be symmetrical with respect to a central longitudinal axis A-A. The symmetry in branches 842 and 843 may result in a similar coupling factor and response over frequency, allowing perfect (or near-perfect) redundancy between the sensors 830 and 832.

In the example of FIG. 8A, the sensor 830 is arranged to sense the Z-axis component of the magnetic field generated in branch 842, and the sensor 832 is arranged to sense the Z-axis component of the magnetic field generated in branch 843. In the example of FIG. 8C, the sensor 830 is arranged to sense the Y-axis component of the magnetic field generated in branch 842, and the sensor 832 is arranged to sense the Y-axis component of the magnetic field generated in branch 843.

Figure 9A:
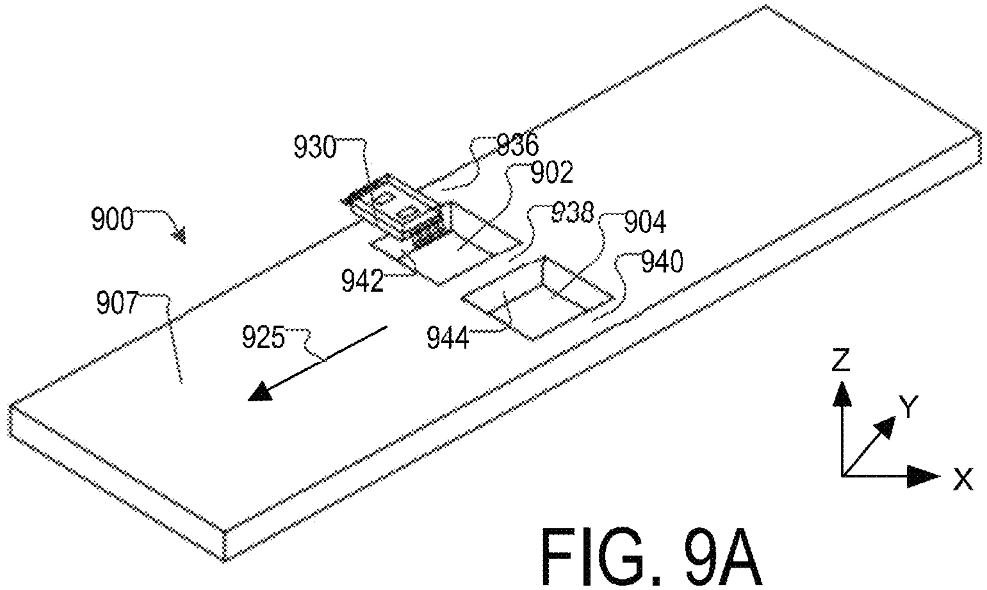
FIG. 9A is a perspective view of a system including a bus bar and a current sensor, according to aspects of the disclosure.
Figure 9B:
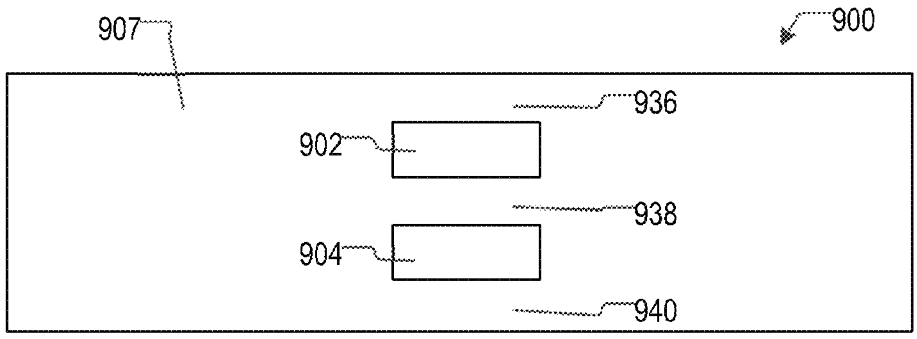
FIG. 9B is a top-down view of a bus bar, according to aspects of the disclosure.

FIGS. 9A-B show an example of a bus bar 900, according to aspects of the disclosure. The bus bar 900 includes more than two branches. Splitting the bus bar 900 into more than two branches may result in a lower current density, a different skin effect profile, and/or a different response over frequency (than the bus bar 300). Furthermore, splitting the bus bar 900 into more than two branches may improve the mechanical robustness and thermal performance of the busbar 900.

The bus bar 900 may have apertures (e.g., through-holes) 902 and 904 formed therein. The apertures 902 and 904 may disposed adjacent to each other. The apertures 902 and 904 may define branches 936, 938, and 940. When in use, electrical current may flow through the bus bar in the direction shown by arrow 925. A sensor 930 may be placed over branch 936. The sensor 930 may be arranged to face a main surface 907 of branch 936 and/or the bus bar 900. The sensor 930 may be the same or similar to the current sensor 110, which is discussed above with respect to FIG. 1D.

Figure 9C:
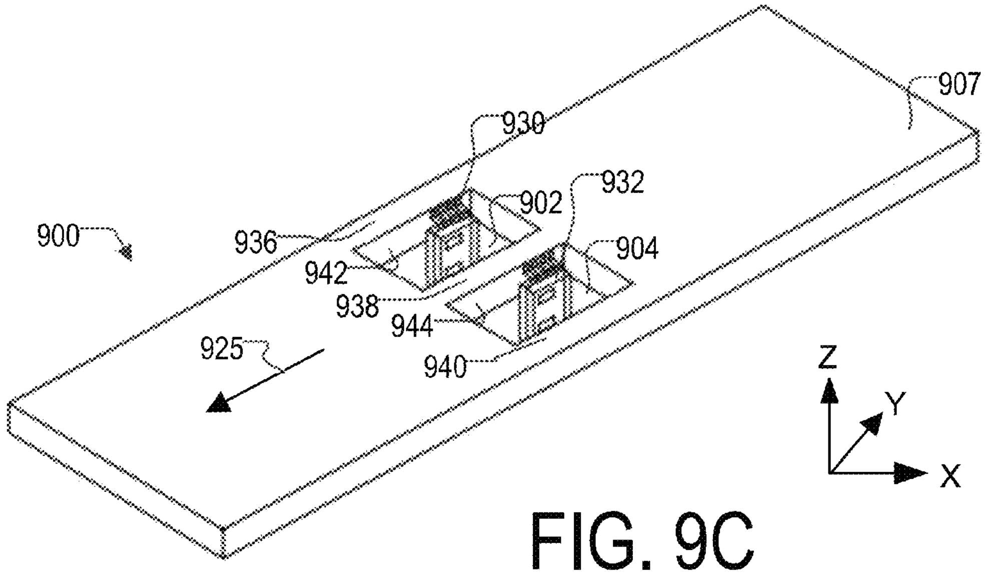
FIG. 9C is a perspective view of a system including a bus bar and a plurality of current sensors, according to aspects of the disclosure.

FIG. 9C shows an alternative implementation in which the sensor 930 is supplemented with a sensor 932. In this implementation, the sensor 930 is inserted in the aperture 902 and arranged to face an edge 942 of the aperture 902. Similarly, the sensor 932 is inserted in the aperture 904 and arranged to face an edge 944 of the aperture 904. In the example of FIG. 9A, the sensor 930 is arranged to sense the Z-axis component of the magnetic field generated in branch 936. In the example of FIG. 9C, the sensor 930 is arranged to sense the X-axis component of the magnetic field generated in branches 936 and 938, and the sensor 932 is arranged to sense the X-axis component of the magnetic field generated in branches 938 and 940.

FIGS. 10A-B show an example of a bus bar 1000, according to aspects of the disclosure. As illustrated, the bus bar 1000 may have an aperture 1002 (e.g., a through-hole). The aperture 1002 may have a trapezoidal shape, as shown. The aperture 1002 may define a branch 1004 and a branch 1006. Branch 1004 may have a length L1 and branch 1006 may have a length L2 that is less than the length L1. A sensor 1030 may be mounted over branch 1004 and a sensor 1032 may be mounter over branch 1006. The sensor 1030 may be arranged to face a main surface 1007 of branch 1004 (and/or the bus bar 1000). The sensor 1032 may be arranged to face the main surface 1007 of branch 1006 (and/or the bus bar 1000). When in use, electrical current may flow through the bus bar in the direction shown by arrow 1025. The sensor 1030 may measure the Z-axis component of the magnetic field that is generated in branch 1004, and the sensor 1032 may measure the Z-axis component of the magnetic field that is produced by branch 1006. In some implementations, each of the sensors 1030 and 1032 may be the same or similar to the current sensor 110, which is discussed above with respect to FIG. 1D. Although in the example of FIGS. 10A-B, the aperture 1002 is shaped as a regular polygon, alternative implementations are possible in which the aperture 1002 is shaped as an irregular polygon.

Figure 11:
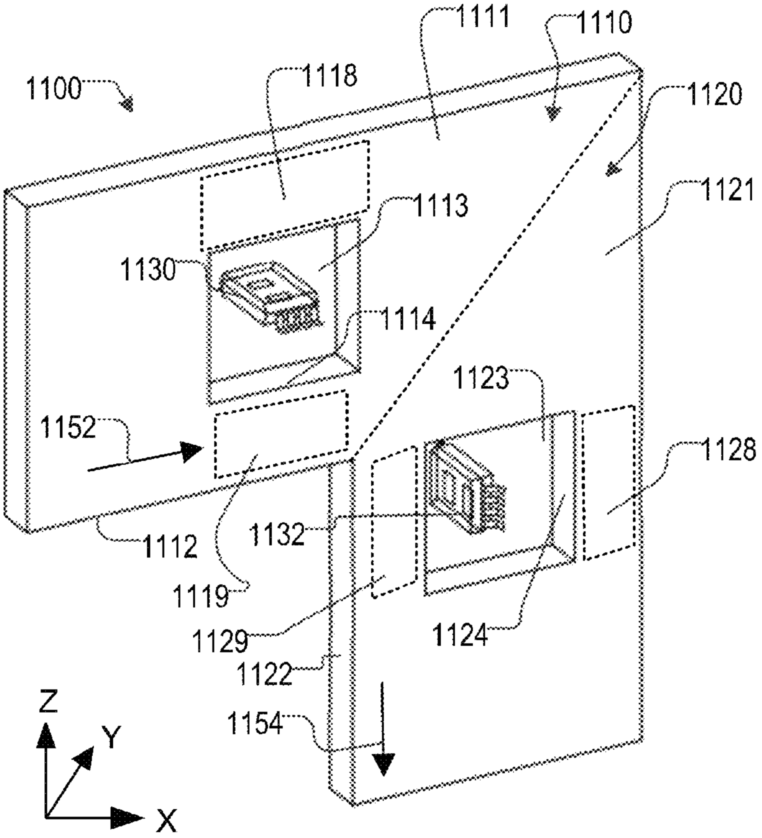
FIG. 11 is a perspective view of a system including a bus bar and a plurality of current sensors, according to aspects of the disclosure.

FIG. 11 is a diagram of an example of a bus bar 1100, according to aspects of the disclosure. The bus bar 1100 may include portions 1110 and 1120. Portion 1110 may have a main surface 1111 and portion 1120 may have a main surface 1121. The main surfaces 1111 and 1121 may rest in the same plane. Portions 1110 and 1120 may have edges 1112 and 1122, respectively. The edges 1112 and 1122 may be transverse to each other (e.g., perpendicular, etc.). Portion 1110 may have an aperture 1113 (e.g., a through-hole) formed therein. The aperture 1113 may define branches 1118 and 1119. Portion 1120 may have an aperture 1123 (e.g., a through-hole) formed therein. The aperture 1123 may define branches 1128 and 1129. A sensor 1130 may be disposed in the aperture 1113 and arranged to face an edge 1114 of the aperture 1113. A sensor 1132 may be disposed in the aperture 1123 and arranged to face an edge 1124 of the aperture 1123. When in use, electrical current may flow through the bus bar in the direction shown by arrows 1152 and 1154. The sensor 1130 may measure the Z-axis component of the magnetic field that is generated in branches 1118 and 1119, and the sensor 1132 may measure the X-axis component of the magnetic field that is produced by branches 1128 and 1129. In some implementations, each of the sensors 1130 and 1132 may be the same or similar to the sensor 110, which is discussed above with respect to FIG. 1D.

Figure 12:
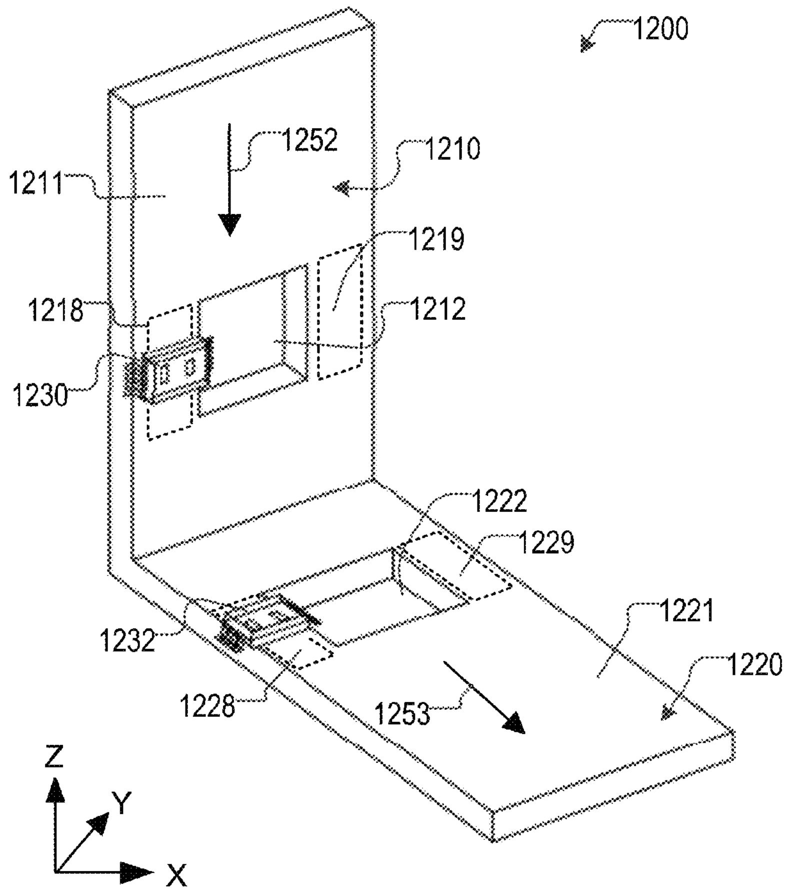
FIG. 12 is a perspective view of a system including a bus bar and a plurality of current sensors, according to aspects of the disclosure.

FIG. 12 is a diagram of an example of a bus bar 1200, according to aspects of the disclosure. The bus bar 1200 may include portions 1210 and 1220. Portion 1210 may have a main surface 1211 and portion 1220 may have a main surface 1221. The main surfaces 1211 and 1221 may be transverse (e.g., perpendicular) to each other, and they may rest in different planes. In the present example, the main surface 1211 is positioned in a Y-Z plane, and the main surface 1221 is positioned in a Y-X plane. Portion 1210 may have an aperture 1212 (e.g., a through-hole) formed therein. The aperture 1212 may define branches 1218 and 1219. Portion 1220 may have an aperture 1222 (e.g., a through-hole) formed therein. The aperture 1222 may define branches 1228 and 1229. A sensor 1230 may be mounted above branch 1218. The sensor 1230 may be arranged to face the main surface 1211 of branch 1218 and/or the bus bar 1200. A sensor 1232 may be mounted above branch 1228. The sensor 1232 may be arranged to face the main surface 1221 of branch 1228 and/or the bus bar 1200. When in use, electrical current may flow in the bus bar 1200 in the direction shown by arrows 1252 and 1253. The sensor 1230 may measure the X-axis component of the magnetic field that is generated in branch 1218, and the sensor 1232 may measure the Z-axis component of the magnetic field that is produced by branch 1228. In some implementations, each of the sensors 1230 and 1232 may be the same or similar to the current sensor 110, which is discussed above with respect to FIG. 1D.

In some implementations, the sensor 1230 may be arranged to measure current in a first range (e.g., −500 A to +500 A) and the sensor 1232 may be arranged to measure current in a second range (e.g., −2000 A to +2000 A). In such implementations, the sensor 1230 may be configured to have a lower error than the sensor 1232 for current measurements that fall in the range of −500 A to +500 A. Furthermore, in such implementations, the sensor 1232 may be configured to have a lower error (than the sensor 1230) for current measurements that fall in the range of −2000 A to −501 A and +501 A to +2000 A. In some respects, when the measurements that are reported by the sensors 1230 and 1232 indicate that the current through the bus bar 1200 is in the range of −500 A to +500 A, electronic circuitry that is coupled to the sensors 1230 and 1232 may choose to use the measurement reported by the sensor 1230 over the measurement that is reported by the sensor 1232. Similarly, when the measurements that are reported by the sensors 1230 and 1232 indicate that the current through the bus bar 1200 is in the range of −2000 A to −501 A or +501 A to +2000 A, electronic circuitry that is coupled to the sensors 1230 and 1232 may choose to use the measurement reported by the sensor 1232 over the measurement that is reported by the sensor 1230 (because the sensor 1232 has a lower error in those current ranges). In some implementations, when the sensors 1230 and 1232 are configured to have different errors in different ranges, the sensors 1230 and 1232 may be configured and used as discussed in U.S. patent application Ser. No. 17/218,783 titled MULTI-GAIN CHANNELS FOR MULTI-RANGE SENSOR, which is incorporated herein by reference in its entirety.

Although in the example of FIG. 12, the current sensors 1230 and 1232 are fine-tuned with respect to different current ranges, alternative implementations are possible in which the current sensors 1230 and 1232 are configured identically and used in a redundant configuration. In some respects, FIGS. 11 and 12 illustrate an example in which complex 3D shapes are used for the bus bars 1100 and 1200, respectively. The use of complex 3D shapes may help achieve equivalent sensing configurations, as well as improve stray magnetic field immunity by allowing the use of physically different axes of measurement when the current sensors in FIGS. 11 and 12 are used in a redundant configuration. Furthermore, the use of complex 3D shapes allows additional mounting flexibility and system integration of the current sensors.

The implementations presented throughout the disclosure with respect to FIGS. 3A-12 are not mutually exclusive. It will be understood that features discussed with respect to different implementations can be combined to produce further implementations. For example, in any of the bus bar implementations discussed with respect to FIGS. 3A-12, a current sensor may be mounted over the main surface of a branch or adjacent to the edge of a branch. Moreover, in any of the bus bar implementations discussed with respect to FIGS. 3A-12, a single current sensor or multiple current sensors may be used to measure the current through the bus bar. In instances in which multiple sensors are used to measure the current through a bus bar, those current sensors may be used to provide cross-talk immunity, redundancy and plausibility check. In instances in which multiple sensors are used to measure the current through a bus bar, those current sensors may have different errors with respect to different current ranges. Any of the bus bars presented throughout the disclosure may be formed of copper, aluminum, and/or any other suitable type of conductive material. The edge-mounting and surface-mounting techniques presented with respect to 3D-E can be used in any of the configurations discussed with respect to FIGS. 3A-12. It will be understood that in any of the configurations discussed with respect to FIGS. 3A-12 the current sensor (or current sensors) may be horizontally mounted, vertically mounted, or both.

In the example FIGS. 3-12, the bus bars 300, 600, 700, 800, 900, 1000, 1100, and 1200 are embedded in a PCB. That is, each of the bus bars 300, 600, 700, 800, 900, 1000, 1100, and 1200 is at least in part encapsulated in the dielectric material that forms the PCB. However, it will be understood that the present disclosure is not limited thereto. For example, in some implementations, any of the bus bars 300, 600, 700, 800, 900, 1000, 1100, and 1200 may be implemented as a standalone article of manufacture. Additionally or alternatively, in some implementations, any of the bus bars 300, 600, 700, 800, 900, 1000, 1100, and 1200 may be integrated into a bridge element (or another conductor) for connecting different components of an electrical system. Stated succinctly, the present disclosure is not limited to any specific implementation of the bus bars 300, 600, 700, 800, 900, 1000, 1100, and 1200.

The concepts and ideas described herein may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, or volatile memory. The term unit (e.g., a addition unit, a multiplication unit, etc.), as used throughout the disclosure may refer to hardware (e.g., an electronic circuit) that is configured to perform a function (e.g., addition or multiplication, etc.), software that is executed by at least one processor, and configured to perform the function, or a combination of hardware and software.

According to the present disclosure, a magnetic field sensing element can include one or more magnetic field sensing elements, such as Hall effect elements, magnetoresistance elements, or magnetoresistors, and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance clement such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing clement, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. A system, comprising:

a conductor having a through-hole and a first notch that are formed therein, the through-hole and the first notch being arranged to define, at least in part, a first branch of the conductor, the through-hole also being arranged to define, at least in part, a second branch of the conductor; and a current sensor that is disposed directly above the first branch of the conductor and to the side of the second branch of the conductor, such that no portion of the current sensor is situated directly above the second branch, wherein the conductor includes a plurality of conductive layers that are embedded in a printed circuit board (PCB), wherein the first branch has a first edge, a second edge, and a central longitudinal axis that is equidistant from the first edge and the second edge. the first edge being shared by the first branch and the through-hole, and the second edge being shared by the first branch and the first notch, wherein the current sensor includes a substrate, a first magnetic field sensing element and a second magnetic field sensing element that are formed on the substrate, the current sensor being configured to perform differential sensing, and the first magnetic field sensing element and the second magnetic field sensing element being disposed on opposite sides of the central longitudinal axis, and wherein a width of the first branch is smaller than a width of the through-hole.

2. The system of claim 1 wherein the second branch is defined by both the through-hole and a second notch that is formed adjacent to the through-hole.

3. The system of claim 1, wherein an air gap is provided between the current sensor and a main surface of the first branch.

4. The system of claim 1, wherein a width of the first branch is greater than a length of the through-hole.

5. The system of claim 1, wherein the first branch has a different length or thickness than the second branch.

6. The system of claim 1, wherein the conductor is a busbar.

7. A system, comprising:

a conductor having a through-hole, a first notch, and a second notch that are formed therein, the through-hole and the first notch being arranged to define, at least in part, a first branch of the conductor, the through-hole and the second notch being arranged to define, at least in part, a second branch of the conductor; and a current sensor that is disposed directly above the first branch of the conductor and to the side of the second branch of the conductor, such that no portion of the current sensor is situated directly above the second branch, wherein the first branch has a first edge, a second edge, and a central longitudinal axis that is equidistant from the first edge and the second edge. the first edge being shared by the first branch and the through-hole, and the second edge being shared by the first branch and the first notch, wherein the current sensor includes a substrate, a first magnetic field sensing element and a second magnetic field sensing element that are formed on the substrate, the current sensor being configured to perform differential sensing, and the first magnetic field sensing element and the second magnetic field sensing element being disposed on opposite sides of the central longitudinal axis.

8. The system of claim 7, wherein a width of the first branch is greater than a length of the through-hole.

9. The system of claim 7, wherein the first branch has a smaller width than a width of the through-hole.

10. The system of claim 7, wherein the second branch has a smaller width than a width of the through-hole.

11. The system of claim 7, wherein the first branch has a same width as the second branch.

12. The system of claim 7, wherein an air-gap is provided between the current sensor and a main surface of the first branch.

13. The system of claim 7, wherein the conductor includes a plurality of conductive layers that are embedded in a printed circuit board (PCB).

14. The system of claim 7, wherein the first branch has a different length than the second branch.

15. The system of claim 7, wherein the first branch has a different thickness than the second branch.

16. The system of claim 7, wherein the through-hole is shaped as an irregular polygon.

17. The system of claim 7, wherein the conductor is a busbar.

18. A system, comprising:

a conductor having a through-hole and a first notch that are formed therein, the through-hole and the first notch being arranged to define, at least in part, a first branch of the conductor, and the through-hole also being arranged to define, at least in part, a second branch of the conductor; and a current sensor that is arranged to face a sidewall of the first branch that is interposed between a top surface and a bottom surface of the first branch, the sidewall having a central longitudinal axis that is equidistant from the top surface and the bottom surface, wherein the current sensor includes a substrate, a first magnetic field sensing element and a second magnetic field sensing element that are formed on the substrate, the current sensor being configured to perform differential sensing, and the first magnetic field sensing element and the second magnetic field sensing element being disposed on opposite sides of the central longitudinal axis.

19. The system of claim 18, wherein a width of the first branch is greater than a length of the through-hole.

20. The system of claim 18, wherein the first branch has a smaller width than a width of the through-hole.

21. The system of claim 18, wherein the conductor includes a plurality of conductive layers that are embedded in a printed circuit board (PCB).

22. The system of claim 18, wherein the first branch has a different length than the second branch.

23. The system of claim 18, wherein the first branch has a different thickness than the second branch.

24. The system of claim 18, wherein the second branch is defined by both the through-hole and a second notch that is formed adjacent to the through-hole.

25. The system of claim 18, wherein the through-hole is shaped as an irregular polygon.

26. The system of claim 18, wherein the conductor is a busbar.

* * * * *